(12) United States Patent
Krone et al.

(10) Patent No.: US 9,851,554 B2
(45) Date of Patent: Dec. 26, 2017

(54) METHOD FOR DISPLACING AT LEAST ONE OPTICAL COMPONENT

(71) Applicant: Carl Zeiss SMT GmbH, Oberkochen (DE)

(72) Inventors: Stefan Krone, Aalen (DE); Lars Berger, Aalen Unterkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/210,533

(22) Filed: Jul. 14, 2016

(65) Prior Publication Data

US 2016/0320608 A1    Nov. 3, 2016

Related U.S. Application Data

(63) Continuation of application No. PCT/EP2015/052733, filed on Feb. 10, 2015.

(30) Foreign Application Priority Data

Feb. 14, 2014  (DE) ................. 10 2014 202 755

(51) Int. Cl.
| | | |
|---|---|---|
| *G03B 27/54* | (2006.01) | |
| *G02B 26/08* | (2006.01) | |
| *G03F 7/20* | (2006.01) | |
| *G02B 7/182* | (2006.01) | |
| *G02B 27/00* | (2006.01) | |

(52) U.S. Cl.
CPC ....... *G02B 26/0816* (2013.01); *G02B 7/1828* (2013.01); *G02B 27/0012* (2013.01); *G03F 7/702* (2013.01); *G03F 7/70075* (2013.01); *G03F 7/70116* (2013.01)

(58) Field of Classification Search
CPC ... G03F 7/70775; G03F 7/702; G03F 7/70116
USPC .................. 355/53, 67, 72–76; 359/819–820
See application file for complete search history.

(56) References Cited

U.S. PATENT DOCUMENTS

| | | |
|---|---|---|
| 9,767,068 B2 | 9/2017 | Kempter |
| 2003/0060921 A1 | 3/2003 | Wiener |
| 2004/0070815 A1 | 4/2004 | Aubuchon |
| 2006/0176146 A1 | 8/2006 | Krishan et al. |
| 2006/0176460 A1* | 8/2006 | Phillips ............... G03F 7/70975 355/67 |

(Continued)

FOREIGN PATENT DOCUMENTS

| | | |
|---|---|---|
| CN | 102257241 A | 11/2011 |
| CN | 102483582 A | 5/2012 |

(Continued)

OTHER PUBLICATIONS

International Search Report and Written Opinion for corresponding PCT Appl No. PCT/EP2015/052733, dated Jun. 3, 2015.

(Continued)

*Primary Examiner* — Hung Henry Nguyen
(74) *Attorney, Agent, or Firm* — Fish & Richardson P.C.

(57) ABSTRACT

A method for displacing an optical component is disclosed, in which the electrical power maximally required when displacing the component is less than the sum of the maximum electrical powers of the at least two actuators used for the displacement.

19 Claims, 16 Drawing Sheets

(56) References Cited

U.S. PATENT DOCUMENTS

| | | |
|---|---|---|
| 2008/0013680 A1 | 1/2008 | Singer et al. |
| 2008/0224251 A1 | 9/2008 | Troost et al. |
| 2008/0246934 A1 | 10/2008 | Van Den Biggelaar |
| 2011/0043791 A1 | 2/2011 | Smilde et al. |
| 2013/0132037 A1 | 5/2013 | Kempter |
| 2014/0009744 A1 | 1/2014 | Li et al. |
| 2014/0043596 A1 | 2/2014 | Fischer et al. |
| 2014/0055767 A1 | 2/2014 | Waldis et al. |
| 2015/0185469 A1* | 7/2015 | Horn ............... G02B 26/0841 355/67 |
| 2016/0195818 A1 | 7/2016 | Baer et al. |

FOREIGN PATENT DOCUMENTS

| | | |
|---|---|---|
| CN | 102666030 A | 9/2012 |
| DE | 10 2011 006 100 A1 | 9/2012 |
| DE | 10 2011 007 917 A1 | 10/2012 |
| DE | 10 2012 218 219 A1 | 4/2014 |
| EP | 1 225 481 A | 7/2002 |
| EP | 2 485 875 B1 | 4/2013 |
| JP | 2013-533633 A | 8/2013 |
| TW | 201229678 A | 7/2012 |
| TW | 201403210 A | 1/2014 |
| WO | WO 2010/049076 A2 | 5/2010 |
| WO | WO 2012/016577 A1 | 2/2012 |
| WO | WO 2013/120926 A1 | 8/2013 |

OTHER PUBLICATIONS

Taiwanese office action and search report, with English translation, for corresponding TW Application No. 104 103 399, dated Jul. 14, 2016.

German Office Action, with translation thereof, for corresponding DE App No. 10 2014 202 755.1, dated Oct. 20, 2015.

Chinese Office Action and Search Report, with English translation thereof, for corresponding Appl No. 201580008654.1, dated Sep. 28, 2017.

* cited by examiner

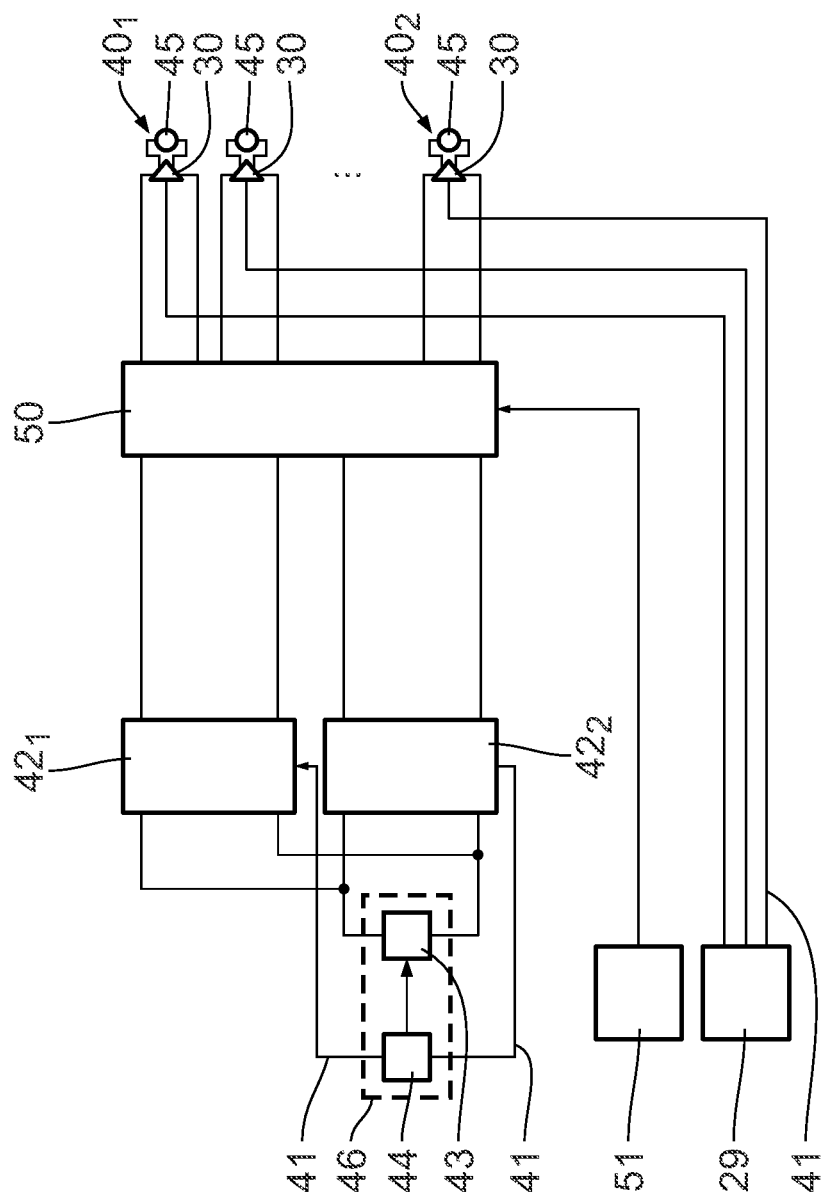

METHOD FOR DISPLACING AT LEAST ONE OPTICAL COMPONENT

CROSS-REFERENCE TO RELATED APPLICATIONS

The present application is a continuation of, and claims benefit under 35 USC 120 to, international application PCT/EP2015/052733, filed Feb. 10, 2015, which claims benefit under 35 USC 119 of German Application No. 10 2014 202 755.1, filed Feb. 14, 2014. The entire disclosure of international application PCT/EP2015/052733 and German Application No. 10 2014 202 755.1 are incorporated by reference herein.

FIELD

The disclosure relates to a method for displacing at least one optical component. The disclosure furthermore relates to an optical assembly, and to a method for designing an optical assembly. Moreover, the disclosure relates to an illumination optical unit and to an illumination system for a projection exposure apparatus, and to a projection exposure apparatus. Finally, the disclosure relates to a method for producing a micro- or nanostructured component, and to a correspondingly produced component.

BACKGROUND

DE 10 2011 006 100 A1 discloses a projection exposure apparatus having a multi-mirror array having actuator-displaceable individual mirrors.

SUMMARY

The present disclosure seeks to improve a method for displacing at least one optical component.

The heart of the disclosure consists in, for the purpose of displacing one or more optical components having at least two degrees of freedom of displacement, predefining a maximum total power which is permitted to be consumed overall by all the actuators during the displacement, ascertaining a corresponding driving protocol for displacing the optical component or components, and displacing the optical component or components in accordance with the driving protocol.

Predefining the maximum power consumption during the displacement limits the electrical power maximally to be provided. This is advantageous for the design of the assembly having the optical component. Limiting the maximum power consumption leads, in particular, to an improvement in the thermal budget of the optical assembly, in particular to a simplified design of the mechanism for heat dissipation.

Ascertaining the drive protocol, in particular ascertaining one or a plurality of displacement trajectories, is carried out, in particular, whilst complying with the predefined maximum power $P_{max}$. In other words, the predefined maximum power $P_{max}$ forms a boundary condition when ascertaining the drive protocol, in particular when ascertaining the displacement trajectories.

Hereinafter, unless explicitly indicated otherwise, power shall denote the electrical power consumption of one of the actuator devices which is consumed thereby during the positioning or displacement of the optical component. In this case, an actuator device denotes the totality of the actuators for positioning or displacing an individual optical component. The actuator device includes, in particular, at least two actuators. Total power shall correspondingly be understood to mean the sum of the electrical power consumption of all the actuator devices which serve for displacing the optical component. In the case of a multiplicity of components to be displaced, in particular of independent, i.e. totally electrically shielded, components, the sum of the respective total powers is also designated as the total system power. The concepts for reducing the total power can be transferred for the purpose of reducing the total system power from an assembly having an individual component to be displaced to a system having a multiplicity of components to be displaced.

Limiting the maximum power consumption also leads to a reduced outlay on cabling and circuitry for providing electrical power in the optical assembly.

A driving protocol for displacing the optical component or components shall be understood to mean, in particular, the temporal profile of the controlled activation of all the actuator devices for displacing the optical components of the optical assembly. The temporal profile determines the temporal profile of the total power consumption of the assembly.

Generally, the optical assembly forms a mechatronic system or a part thereof. The mechatronic system includes in particular at least one mechanical component, in particular in the form of an optical component, in particular in the form of a mirror. Moreover, the mechatronic system includes electronic components and, in particular, at least two actuators for displacing the mechanical component.

For each actuated mechanical element of the system, the respective displacement trajectory denotes the geometrical path of a position change—brought about by the actuation—in space from a start position to a target position. On the one hand, the displacement trajectory can be defined completely as a continuous function of the spatial coordinates. However, it can also be defined only by selected support points, i.e. discrete spatial coordinates, which have to be adopted in a predefined order in the course of the position change. At all events, each displacement trajectory includes the discrete spatial coordinates of the start and target positions.

The totality of the geometrical paths arising during the spatial position change of a plurality of actuated mechanical elements of a system is designated as an ensemble of the displacement trajectories of the actuated mechanical elements.

In accordance with one aspect of the disclosure, provision can be made for taking account of predefined boundary conditions for the course of the displacement trajectories when ascertaining the drive protocol. It is possible, in particular, to predefine for each individual one of the displacement trajectories allowed regions, in which the displacement trajectory is permitted to run, and/or forbidden regions, in which the displacement trajectory is not permitted to run. Such regions can be ascertained for example on the basis of an area which reproduces the required power consumption of the actuators for the possible displacement positions. This can be a higher-dimensional area. In particular, a (K·n)-dimensional area can be involved, wherein K denotes the number of actuators of the individual mechanical devices and n denotes the number of mechanical devices to be displaced. In other words, the allowed and/or forbidden regions can be predefined not only for the individual displacement trajectories but also for the ensemble displacement trajectory.

The actuations—required for the realization of a displacement trajectory—of the mechanical elements of the system via electrical signals, in particular a sequence of electrical signals, are designated as driving of the mechanical elements respectively actuated. In this case, a distinction is made between the driving of an individual mechanical element and the driving of the ensemble of all actuated mechanical elements of the system. The controlled, in particular regulated, electrical signals of the driving are designated as drive signals or driving signals. The totality of the electronic circuits which are used in the system for the driving of an (at least one) actuated mechanical element are designated as drive electronics or driving electronics. For those cases in which the drive electronics can be reconfigured during the operation of the system, the drive signals concomitantly include the signals for a possible reconfiguration of the drive electronics.

The order of the values of the drive signals which are to be set for a mechanical element in order to realize a specific displacement trajectory is designated as drive scheme or driving scheme for the mechanical element.

The temporal sequence of the values of all the drive signals which are required for realizing an ensemble of displacement trajectories of the actuated mechanical element of a system is designated as drive protocol or driving protocol for the actuated mechanical elements. The driving protocol thus includes the totality of all the driving schemes.

The heart of the disclosure consists, in particular, in the combined electronic driving of a plurality of actuators in a mechatronic overall system, in particular for multidimensionally actuated mirrors, in particular in an EUV or DUV lithography apparatus, in such a way that the peak electrical power of the overall system during the actuation is reduced, in particular minimized, in comparison with a worst-case design. The actuators can also be driven in such a way that the power loss of the overall system during the actuation is reduced, in particular minimized, in comparison with a worst-case design. The reduction, in particular the minimization, of the power loss, in particular of the average power loss, of the overall system can also be taken into consideration as a secondary condition in the reduction, in particular the minimization, of the peak electrical power of the overall system.

In this case, the mechanical orientation of the mechanical elements, in particular of the multidimensionally actuatable mirrors, can be adapted, in particular optimized, in such a way that the peak electrical power and/or the power loss during the actuation, in particular in the case of specific, predefined driving protocols, is minimized. In this case, too, the reduction, in particular the minimization of the power loss can be taken into consideration as a secondary condition in the reduction, in particular the minimization, of the peak electrical power. In this case, the predefined driving protocols designate, in particular, the driving signals for all actuators which are required in order to achieve specific, predefined settings of the mirrors, wherein a setting denotes the totality of the displacement positions of all the mirrors.

The disclosure is generally advantageous for a mechatronic system including a plurality of actuators which are used for the electronic setting and regulation of the position of at least one mechanical element, in particular a plurality of mechanical elements. The mechanical elements can be in particular mirrors, in particular individual mirrors of a field facet mirror, in particular individual mirrors of a multi-mirror array (MMA). Micromirrors can be involved, in particular. The mechanical elements are linked to an overall system, wherein upon their actuation electrical energy is converted into kinetic energy and/or potential energy.

The mechatronic system includes electrical, in particular electronic, components. It includes electrical driver amplifiers, in particular. It can include digital logic components. It can have further electronic components, for example position sensors, for controlling or regulating the mechanical elements to be actuated.

Hereinafter, for the sake of simplicity, firstly reference is made to the displacement of an individual one of the optical components. However, the aspects presented are advantageous in particular in the displacement of a plurality of components, in particular in the displacement of groups of components, in particular in a displacement of a plurality of optical components in an interconnected arrangement, i.e. a displacement of a plurality of optical components in a corresponding manner in respect of the interconnected arrangement.

The driving protocol can be ascertained in particular depending on the predefined maximum power ($P_{max}$). The predefined maximum power ($P_{max}$) is in particular less than the sum (S) of the maximum powers ($P^i_{max}$) which can be consumed by the individual actuator devices of the optical component. The following holds true in particular: $P_{max}$: S<1, in particular $P_{max}$: S<0.8, in particular $P_{max}$: S<0.6.

The driving protocol is determined in particular depending on $P_{max}$. It is adapted in particular to $P_{max}$. It can be optimized according to predefinition of $P_{max}$. It can be optimized in particular via an optimization method, in particular an iterative method. It can also be selected from a number of different protocols.

The driving protocol predefines a displacement path, which is also designated as the displacement trajectory of the optical component for the displacement from a first displacement position into a second displacement position. It has been recognized according to the disclosure that the power consumption of the actuator devices, in particular the total power consumption of all the actuator devices for displacing the optical component, is dependent on the displacement trajectory, in particular on the beginning and end points thereof. In particular the peak value of the total power consumption of all the actuator devices is dependent on the displacement trajectory, in particular the ensemble of the displacement trajectories. The peak value can be reduced, in particular minimized, via a targeted choice of the displacement trajectories. The power consumption of the actuator devices is position- and/or path-dependent, in particular. It has been recognized according to the disclosure that, therefore, in the case of a system having at least two actuator devices, it is possible to optimize the power consumption in the displacement of the optical component by selection and/or adaptation of the displacement trajectory and/or by targeted adaptation of the driving schemes of the individual actuator devices and/or the structural orientation thereof, in particular relative to the optical component, in particular the mechanical mounting thereof.

Via a suitable selection of a driving scheme, i.e. of the control, in particular of the order, of the driving signals which are to be set for an individual given mechanical element in order to realize a specific displacement trajectory, the power consumption of the actuator devices of this component can be influenced, in particular reduced, in particular minimized.

Via a suitable selection of a driving scheme, it is possible to ensure, moreover, that predefined boundary conditions for the displacement trajectories and/or displacement positions are taken into account. It is possible to ensure, in particular, that displacement positions which are not permitted to be moved to are avoided. This makes it possible to ensure that damage to the mechanical elements and/or the actuator devices thereof is ruled out.

In particular in the case of a mechatronic system having a plurality of elements to be displaced, the total power consumption can also be influenced, in particular minimized, by the driving protocol, i.e. the temporal sequence of the values of all the drive signals which are required for realizing an ensemble of displacement trajectories of the actuated mechanical elements.

The optical component is in particular a mirror, in particular an individual mirror of a multi-mirror array. In particular an individual mirror of a facet mirror of an illumination optical unit of a projection exposure apparatus for microlithography, in particular for EUV or DUV lithography, can be involved. In particular a micromirror of a microelectromechanical system (MEMS) of a multi-mirror array (MMA) can be involved. The optical component can also be some other mechatronically actuated optical component of a projection exposure apparatus, in particular of an EUV lithography apparatus. An individual mirror of a field facet mirror or of a pupil facet mirror can also be involved, in particular. For a general explanation of the actuator principle, reference should be made to DE 10 2011 007 917 A1, which is hereby intended to be part of the present application.

The solution according to the disclosure, in particular the different realization variants, afford the following advantages, in particular:

The peak electrical power and/or the average electrical power loss is reduced in comparison with a worst-case design, in particular a non-power-loss-optimized, independent driving of the individual actuators.

The mechanical and/or thermal system design is simplified. The cooling outlay, in particular, is reduced.

The system lifetime is increased. This is attributable in particular to a reduced power loss and thus less generated heat.

The dynamic range of the actuators is increased. This makes it possible to increase the range of the actuatable deflection of the mechanical elements for the same power consumption compared with a worst-case design.

The position regulation is simplified. In particular, the position regulation in systems with hysteresis is simplified.

In accordance with one aspect of the disclosure, provision is made, in order to ascertain the driving protocol, for ascertaining the displacement trajectory, in particular the ensemble of the displacement trajectories, and/or an activation scheme of the actuator devices, in particular for selecting and/or adapting them/it from a list, and for ascertaining the driving protocol and/or driving protocol depending on the displacement trajectory, or the ensemble of the displacement trajectories, and/or the activation scheme. It has been recognized according to the disclosure that, in order to ascertain an advantageous driving protocol, firstly the travel paths, i.e. the displacement trajectories, of the optical components can be adapted, in particular optimized, and secondly that the driving of the actuator devices can be optimized. In this case, the activation scheme of the actuator devices can firstly include the sequence of the driving signals of the actuator devices, i.e. temporal elements. It can also include a profile of the amplitudes, in particular of the maximum possible amplitudes, of the driving signals, in particular of the supply voltages of the amplifier stages of the individual actuators.

In accordance with one aspect of the disclosure, provision is made for choosing and/or determining the displacement trajectory in such a way that it points in a predetermined direction at the beginning of the displacement process. In this case, it is possible in particular to exploit the fact that an optical component having at least two degrees of freedom of displacement has a direction-dependent mechanical stiffness, i.e. that the mechanical stiffness of the mounting of the component has a direction dependence. The displacement trajectory is chosen in particular in such a way that it points in the direction of the least stiffness at the beginning of the displacement process.

In the case of a direction dependence of the static friction of the optical component, provision can also be made for choosing the displacement trajectory in such a way that it points in the direction of the minimum static friction at the beginning of the displacement process. This direction need not necessarily correspond to the direct direction from the first to the second displacement position.

In accordance with a further aspect of the disclosure, the displacement trajectory points in different directions at at least two points. In other words, the optical component is not displaced along a rectilinear trajectory from the first displacement position into the second displacement position. The displacement trajectory can be embodied as rectilinear in sections. It can have in particular two or more rectilinear sections. The rectilinear sections can run parallel to specific preferred directions. They can run in particular parallel to the preferred directions defined by the actuators. They can also run parallel to preferred directions defined by the mechanical mounting of the optical component.

The displacement trajectory can also be embodied as curved. It can have in particular a constant radius of curvature.

A combination of a displacement trajectory that is straight in sections and a curved displacement trajectory is likewise possible.

In accordance with a further aspect of the disclosure, the displacement trajectory runs from the first displacement position initially into a zero position and then from the latter into the second displacement position. In this case, the zero position should be understood to mean that position of the optical component which requires the minimum total electrical power. The zero position is in particular the position adopted by the optical component if none of the associated actuator devices is activated, i.e. if the total electrical power for displacing the optical component is identical to zero. In particular, a neutral position of the optical component can be involved. This can be in particular the position spontaneously adopted by the optical component if none of the actuators is activated.

It is also possible to provide a short residence duration in the zero position. In this case, provision can be made, in particular, for compensating for and/or correcting a hysteresis in the zero position. This makes it possible to head for the second displacement position, i.e. the target position, always from a reproducible reference position without hysteresis. A stable position regulation can be significantly simplified as a result.

Residence in the reproducible zero position can also be used simultaneously for calibration, in particular for recalibration, of sensors which are used for the position regulation of the optical component.

In accordance with a further aspect of the disclosure, the driving of the actuator devices, in particular the activation scheme thereof, is improved, in particular optimized.

In accordance with one aspect of the disclosure, provision is made for asynchronously activating different actuator devices or controlling the activation thereof. Provision is made, in particular, for at least partly sequentially activating different actuator devices or controlling the activation thereof. The activation of the actuator devices can be overlapping. In other words, it is possible to simultaneously activate more than one actuator device or control the activation thereof. The activation of the actuator devices or the control thereof can also be strictly sequential, i.e. non-overlapping. In this case, at every point in time a maximum of a single actuator is activated or the activation thereof is controlled. The activation of the actuator devices can be temporally interleaved. It is possible, in particular, to activate the actuator devices of the same component in a temporally interleaved manner. It is also possible to activate the actuator devices of different components in a temporally interleaved manner. The total system power can be reduced as a result. It is possible for the actuator devices of the same component to be activated or the activation thereof to be controlled in each case in a predefined order. It is also possible for each of the actuator devices to be activated or the activation thereof to be controlled in each case in predefined intervals of a clock cycle predefined by the control device.

In accordance with a further aspect of the disclosure, for ascertaining the driving protocol an activation scheme is ascertained in which the supply voltage of at least one actuator driver amplifier is adaptively adapted. The adaptive adaptation of the supply voltage can in particular also be performed in groups for a plurality of actuators, in particular for actuators of different components, simultaneously.

In accordance with a further aspect of the disclosure, determining the driving protocol involves taking account of a possible storage of electrical energy in a local store and/or an electromagnetic crosstalk between actuator devices of at least two mechanical devices. It has been recognized according to the disclosure that it is possible that electrical energy is liberated during a displacement of one or more of the components, which electrical energy can be locally stored. This is the case, in particular, if a component is displaced from a position whose setting requires a high electrical energy or power into a position whose setting requires a lower absolute value of electrical energy or power. The locally stored electrical energy can be used for displacing the same component and/or for displacing a different component.

It has additionally been recognized that an electromagnetic crosstalk between different actuators, in particular between different actuator devices of different components, can occur. Such an electromagnetic crosstalk can be utilized constructively.

There are various possibilities for optimization when ascertaining the driving protocol. By way of example, it is possible firstly to determine or predefine a displacement trajectory or an ensemble of displacement trajectories, then to determine or predefine a driving scheme for the actuator devices of the individual mechanical elements and, finally, to determine the driving protocol, i.e. the temporal sequence of the values of all the driving signals for realizing the ensemble of displacement trajectories. In this case, different predefinitions, for example for the possible course of the displacement trajectories and/or predefinition or exclusion of specific driving schemes, can be taken into account as boundary conditions. For different variants and details of these concepts, reference should be made to the description of the exemplary embodiments. The variants presented by way of example herein can be combined with one another substantially arbitrarily.

The disclosure also seeks to improve an optical assembly.

An optical assembly can have at least one mechanical device in the form of an optical component having at least two degrees of freedom of displacement, at least two electrical actuator devices for displacing the at least one mechanical device, and a control device for controlling the displacement. The heart of the disclosure consists in the fact that at least one of the devices is adapted to at least one displacement trajectory in such a way that the maximum total power consumption of the actuator devices during the displacement of the mechanical device along the displacement trajectory is at most equal in magnitude to a predefined maximum value ($P_{max}$). In this case, the maximum value $P_{max}$ is less than the sum S of the maximum powers $P_{max}$ which can be consumed by the individual actuator devices. The following holds true in particular: $P_{max}$: S≤0.9, in particular $P_{max}$: S≤0.8, in particular $P_{max}$: S≤0.7, in particular $P_{max}$: S≤0.6, in particular $P_{max}$: S≤0.5.

Preferably, the optical assembly includes a multiplicity of actuator-displaceable mechanical devices adapted in this way.

In accordance with one aspect of the disclosure, the mechanical device, in particular the optical component, has at least two rotation axes and the actuator device has at least two actuation axes, wherein the rotation axes are rotated by an angle $\phi>0°$ relative to the actuation axes. In other words, the actuation axes do not coincide with the rotation axes of the component to be displaced. This generally has the effect that the activation of an individual actuator device leads to a pivoting of the component which is a combination of two pivotings about the two rotation axes.

The rotation axes of the component to be pivoted are usually predefined by the structural details thereof, in particular of the mechanical mounting thereof. A rotation or pivoting of the actuation axes relative to the rotation axes of the mechanical device is possible for example via a targeted arrangement of the actuators relative to the optical component. This can be taken into account in particular in the system design, i.e. in the design of the system, in particular of the optical assembly, in particular before the start-up thereof.

In accordance with one aspect of the disclosure, it is provided that the angle $\phi$ by which the rotation axes of the optical component are rotated relative to the actuation axes is chosen in such a way that the peak electrical power required for setting all the predefined displacement positions of the optical component is reduced, in particular minimized.

This choice can be made in the context of a complex minimum-maximum optimization task. In this case, firstly, for a predefined set of displacement positions and/or displacement trajectories, the maximum total electrical power required for setting therein is determined. It has been recognized according to the disclosure that this maximum is generally dependent on the angle $\phi$, i.e. on the relative positioning of the actuation axes with respect to the rotation axes. The preferred angle $\phi$ is one which leads to a minimization of this maximum.

In accordance with a simplified alternative, provision can be made merely for ascertaining the displacement position which requires maximum mechanical active power, and for choosing the angle $\phi$ in such a way that the total electrical power interrogated for this purpose, which in particular concomitantly includes the non-usable power loss during the actuation, is reduced, in particular minimized. In this case, the relative orientation of the actuation axes with respect to one another is fixedly predefined.

In accordance with a further aspect of the disclosure, the mechanical device is arranged in such a way that it has a zero position chosen in such a way that the peak electrical power required for setting all the predefined displacement positions of the mechanical device is minimized.

In this case, the zero position denotes the position assumed by the mechanical device, i.e. the optical component, in the absence of an activation of the actuators. The zero position can advantageously correspond to a preferred displacement position of the optical component, in particular to a displacement position which corresponds to a specific optical setting. The zero position can in particular also correspond as an average value, in particular as a weighted average value, of different, in particular all, provided displacement positions of the optical component. In this case, the weighting can be determined depending on the frequency with which a given displacement position is intended to be set and/or depending on the total power demand required therefor.

In accordance with a further aspect of the disclosure, the optical assembly includes a storage device for locally storing electrical energy. The storage device can include in particular one storage capacitor or a plurality of storage capacitors. It is possible, in particular, to provide each of the actuator devices with a corresponding storage capacitor. It is also possible to provide a common storage capacitor for a plurality of actuator devices, in particular for a plurality of optical components. It may be advantageous, in particular, to provide in each case a dedicated storage capacitor for predetermined groups of the components to be displaced.

The disclosure also seeks to improve a method for designing an optical assembly. This can be achieved via the minimum-maximum optimization method already described above.

The disclosure further seeks to improve an illumination optical unit and an illumination system for a projection exposure apparatus, and also a projection exposure apparatus. These objects are achieved via an illumination optical unit, an illumination system and respectively a projection exposure apparatus having an optical assembly in accordance with the previous description.

The advantages are evident from those of the optical assembly.

The disclosure seeks to improve a method for producing a micro- or nanostructured component and a component produced in this way.

This can be achieved by providing a projection exposure apparatus having an optical assembly in accordance with the previous description.

The advantages are evident from those of the assembly.

BRIEF DESCRIPTION OF THE DRAWINGS

Further advantages and details of the disclosure are evident from the description of exemplary embodiments with reference to the drawings, in which:

FIG. 22 shows a schematic illustration of an amplifier circuit with a multiplexer for the supply voltages of the amplifier stages.

DETAILED DESCRIPTION

Firstly, the basic construction of a projection exposure apparatus 1 is described below with reference to the figures. The disclosure is described in particular in connection with such a projection exposure apparatus 1. However, the disclosure is generally applied to mechatronic systems whose mechanical elements change their displacement positions at regular intervals. The disclosure is of interest in particular for mechatronic systems whose mechanical elements are intended to change their displacement positions in an interconnected arrangement. In this case, the mechanical elements can be in particular mirror elements, for example of a multi-mirror array (MMA), in particular having micromirrors.

Figure 1:
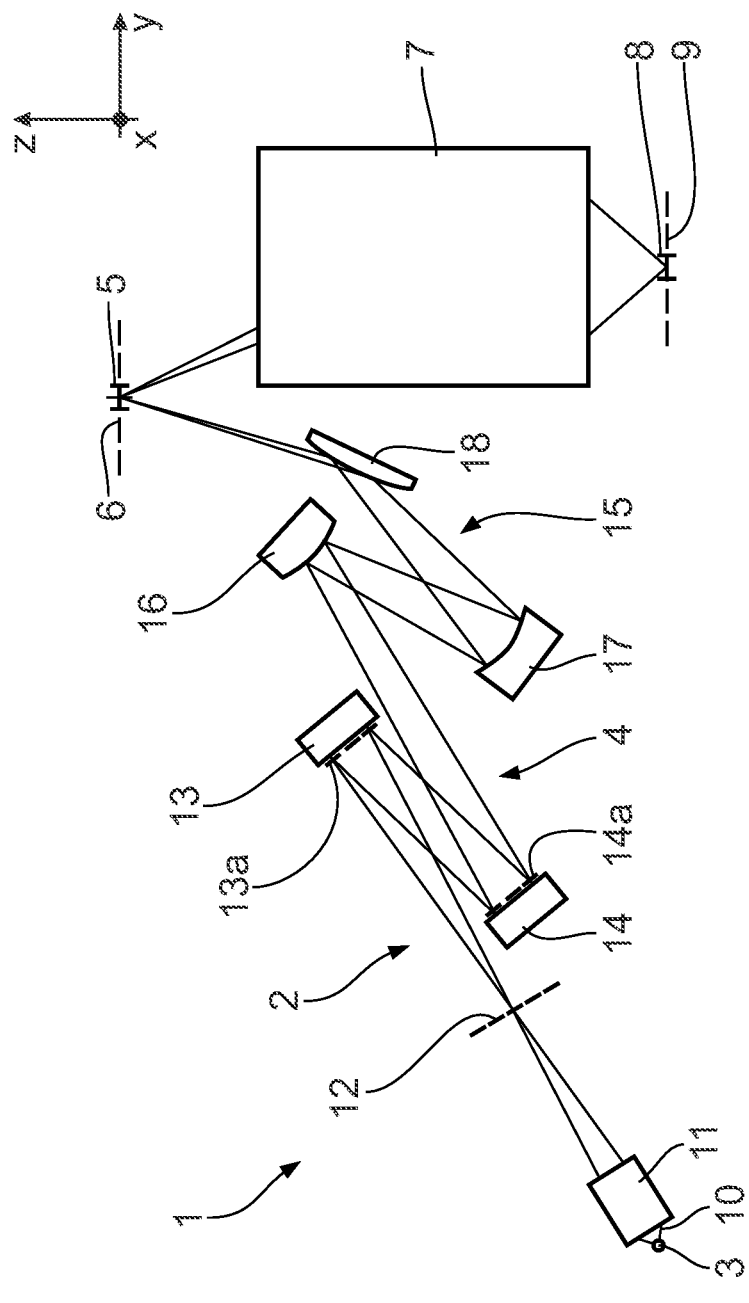
FIG. 1 shows a schematic illustration of a projection exposure apparatus for microlithography in a meridional section.

FIG. 1 schematically shows a projection exposure apparatus 1 for microlithography in a meridional section. An illumination system 2 of the projection exposure apparatus 1 has, besides a radiation source 3, an illumination optical unit 4 for exposing an object field 5 in an object plane 6. The object field 5 can be configured as rectangular or arcuate with an x/y aspect ratio of 13/1, for example. A reflective reticle arranged in the object field 5 and not illustrated in FIG. 1 is exposed in this case, the reticle bearing a structure to be projected by the projection exposure apparatus 1 for producing micro- or nanostructured semiconductor components. A projection optical unit 7 serves for imaging the object field 5 into an image field 8 in an image plane 9. The structure on the reticle is imaged onto a light-sensitive layer of a wafer arranged in the region of the image field 8 in the image plane 9, the wafer not being illustrated in the drawing.

The reticle, which is held by a reticle holder (not illustrated), and the wafer, which is held by a wafer holder (not illustrated), are scanned synchronously in the y-direction during the operation of the projection exposure apparatus 1. Depending on the imaging scale of the projection optical unit 7, it is also possible for the reticle to be scanned in the opposite direction relative to the wafer.

With the aid of the projection exposure apparatus 1, at least one part of the reticle is imaged onto a region of a light-sensitive layer on the wafer for lithographically producing a micro- or nanostructured component, in particular a semiconductor component, for example a microchip. Depending on the embodiment of the projection exposure apparatus 1 as a scanner or as a stepper, the reticle and the wafer are moved in a temporally synchronized manner in the y-direction continuously in scanner operation or step by step in stepper operation.

The radiation source 3 is an EUV radiation source having an emitted used radiation in the range of between 5 nm and 30 nm. A plasma source here, for example a GDPP (gas discharge produced plasma) source, or an LPP (laser produced plasma) source can be involved in this case. Other EUV radiation sources, for example those based on a synchrotron or on a free electron laser (FEL), are also possible. The radiation source 3 can also be a DUV radiation source or generally a radiation source for generating illumination radiation in a different wavelength range. The disclosure has proved to be advantageous in particular for applications in EUV and DUV lithography. EUV radiation 10, which emerges from the radiation source 3, is focused by a collector 11. A corresponding collector is known from EP 1 225 481 A, for example. Downstream of the collector 11, the EUV radiation 10 propagates through an intermediate focal plane 12, before impinging on a field facet mirror 13 having a multiplicity of field facets 13a. The field facet mirror 13 is arranged in a plane of the illumination optical unit 4 that is optically conjugate with respect to the object plane 6.

The EUV radiation 10 is also designated hereinafter as used radiation, illumination light or as imaging light.

Downstream of the field facet mirror 13, the EUV radiation 10 is reflected by a pupil facet mirror 14 having a multiplicity of pupil facets 14a. The pupil facet mirror 14 lies either in the entrance pupil plane of the illumination optical unit 7 or in a plane that is optically conjugate with respect thereto. The field facet mirror 13 and the pupil facet mirror 14 are constructed from a multiplicity of individual mirrors 23, which are described in even greater detail below. In this case, the subdivision of the field facet mirror 13 into individual mirrors 23 can be such that each of the field facets 13a, which per se illuminate the entire object field 5, is represented by exactly one of the individual mirrors 23. Alternatively, it is possible for at least some or all of the field facets 13a to be constructed via a plurality of such individual mirrors 23. The same correspondingly applies to the configuration of the pupil facets 14a of the pupil facet mirror 14, which are respectively assigned to the field facets 13a and which can be formed in each case by a single individual mirror 23 or by a plurality of such individual mirrors 23.

The EUV radiation 10 impinges on the two facet mirrors 13, 14 at an angle of incidence, measured normal to the mirror surface, which is less than or equal to 25°. The EUV radiation 10 is therefore applied to the two facet mirrors 13, 14 in the range of normal incidence operation. Application with grazing incidence is also possible. The pupil facet mirror 14 is arranged in a plane of the illumination optical unit 4 that constitutes a pupil plane of the projection optical unit 7 or is optically conjugate with respect to a pupil plane of the projection optical unit 7. With the aid of the pupil facet mirror 14 and an imaging optical assembly in the form of a transfer optical unit 15 having mirrors 16, 17 and 18 designated in the order of the beam path for the EUV radiation 10, the field facets 13a of the field facet mirror 13 are imaged into the object field 5 in a mutually superimposing manner. The last mirror 18 of the transfer optical unit 15 is a mirror for grazing incidence ("grazing incidence mirror"). The transfer optical unit 15 together with the pupil facet mirror 14 is also designated as a sequential optical unit for transferring the EUV radiation 10 from the field facet mirror 13 toward the object field 5. The illumination light 10 is guided from the radiation source 3 toward the object field 5 via a plurality of illumination channels. Each of these illumination channels is assigned a field facet 13a of the field facet mirror 13 and a pupil facet 14a of the pupil facet mirror 14, the pupil facet being disposed downstream of the field facet. The individual mirrors 23 of the field facet mirror 13 and the pupil facet mirror 14 can be tiltable by an actuator system, such that a change in the assignment of the pupil facets 14a to the field facets 13a and correspondingly a changed configuration of the illumination channels can be achieved.

The mirror elements 23 of the illumination optical unit 4 are preferably arranged in an evacuatable chamber. They are mechanically undamped to the greatest possible extent, such that they react very sensitively to disturbances as a result of vibrations.

The construction of the field facet mirror 13, in particular of the individual mirrors 23 thereof, is described in greater detail below. However, the disclosure is not restricted thereto. Generally, the individual mirrors 23 are parts of an optical assembly 25.

The individual mirrors 23 are also designated hereinafter as mirror elements 23. They are designed to be tiltable by an actuator system, as will be explained below. Overall, the field facet mirror 13 has at least 300, in particular at least 1000, in particular at least 10 000, in particular at least 100 000, individual mirrors 23.

The mirror elements 23 can be, in particular, so-called micromirrors. They have in particular dimensions in the range of $10^{-8}$ m² to $10^{-4}$ m², in particular in the range of $10^{-7}$ m² to $10^{-5}$ m². In principle, macroscopic mirrors having larger dimensions can also be involved.

Figure 2:
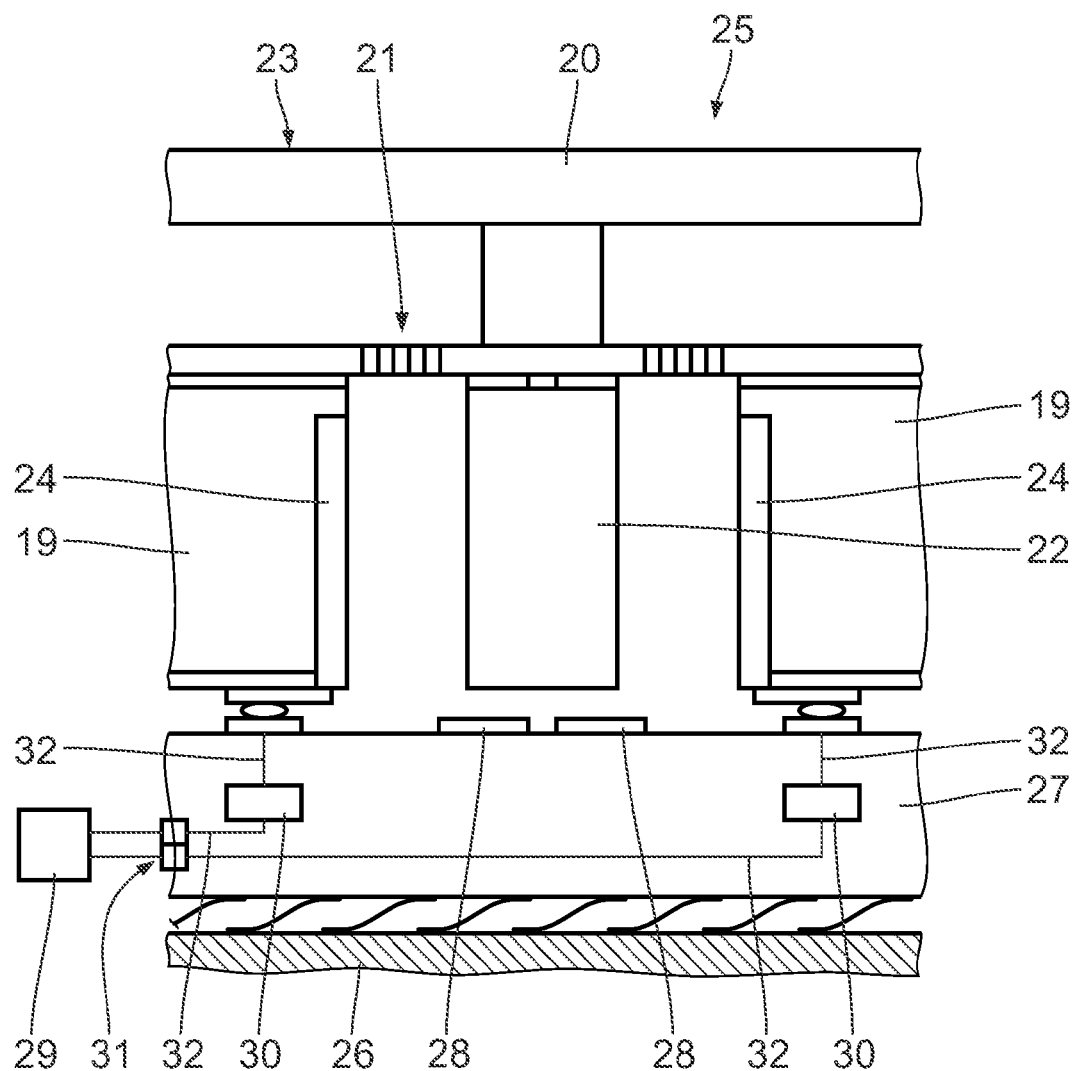
FIG. 2 shows a schematic cross section through an excerpt from an optical assembly with an actuator-displaceable mirror.

In the case of the principle illustrated in FIG. 2, the mirror elements 23 are arranged on a first carrying structure 19. The latter is mechanically connected to a mirror body 20 of one of the mirror elements 23 via a heat-conducting section. Part of the heat-conducting section is an articulated body 21, which permits the mirror body 20 to be tilted relative to the first carrying structure 19. The articulated body 21 can be designed as a flexure that permits the mirror body 20 to be tilted about defined tilting axes, for example about one or two tilting axes, in particular arranged perpendicular to one another. For details of the tiltable arrangement of the mirror elements 23, in particular the arrangement thereof in the first carrying structure 19, reference should be made to DE 10 2011 006 100 A1 and WO 2010/049 076 A2, which are hereby intended to be fully part of the present application.

The mirror element 23 is in each case mechanically connected to an actuator pin 22. The actuator pin 22 forms an electrode which is mechanically connected to the mirror, and which is also designated hereinafter as mirror electrode.

The first carrying structure 19 forms in each case a sleeve surrounding the actuator pin 22. Actuator electrodes 24 are in each case integrated in the sleeve. In each case at least one actuator electrode 24 is provided per degree of freedom of tilting. Preferably, in each case two actuator electrodes 24 are provided per degree of freedom of tilting. It is also possible to provide three actuator electrodes 24 for tilting the mirror element 23 with two degrees of freedom of tilting. The three actuator electrodes 24 are preferably arranged in a manner offset in each case by 120° relative to one another in the circumferential direction. An arrangement that deviates from this is likewise possible.

By generating a potential difference between one or more of the actuator electrodes 24 and the actuator pin 22, it is possible to generate an electrostatic force on the actuator pin 22 which can lead to a tilting of the mirror element 23. Generally, an actuator voltage $V_{Act}$ is applied to the actuator electrodes 24 for tilting the mirror element 23.

Instead of electrostatic or capacitive actuators which are used in accordance with the principle illustrated in FIG. 2, electromagnetic actuators, in particular Lorentz actuators or reluctance actuators, can also be provided for tilting the mirror elements 23. For details, reference should be made to WO 2010/049 076 A2, for example.

Amplifier stages 30 are provided for applying the actuator voltage $V_{Act}$ to the actuator electrodes 24, the amplifier stages being driven via a control device 29.

FIG. 2 additionally schematically illustrates a second carrying structure 26. The second carrying structure 26 serves in particular for arranging and/or accommodating further functional parts, in particular electrical parts. It serves in particular for accommodating an application specific integrated circuit (ASIC) 27. In particular, the actuator electrodes 24 can be driven via the ASIC 27. Sensors 28 for detecting the displacement position of the individual mirror 23 can be arranged on the ASIC 27. For further details of the structural construction of the optical assembly 25, reference should be made in particular to DE 10 2011 006 100 A1 and WO 2010/049 076 A2 and also WO 2013/120 926 A1 and DE 10 2012 218 219.5, which are hereby likewise intended to be fully part of the present application.

As already mentioned, the concept according to the disclosure for actuating the mirror elements 23 is not restricted to electrostatic actuators. It is in particular also applicable to an optical assembly 25 having electromagnetic actuators, in particular having Lorentz actuators or having reluctance actuators. Exemplary realization variants are explained below with reference to FIGS. 3 to 7. The principles described herein can in turn be applied to other realizations of the actuators. Unless indicated otherwise, the reference to a specific type of actuator is not intended to have a restrictive effect. The actuator devices 45 of the exemplary embodiments illustrated can include in particular electrostatic actuators or electromagnetic actuators, in particular Lorentz actuators or reluctance actuators.

The illustrated concepts for the orientation, design and driving of the actuators are not bound to a specific type of actuator, but rather can be applied to other types.

In FIGS. 3 to 6, the mechanical details of the optical assembly 25, in particular of the individual mirror 23, are not illustrated in a detailed manner for the sake of simplicity. For such details, reference should be made to the documents cited above.

Figure 4:
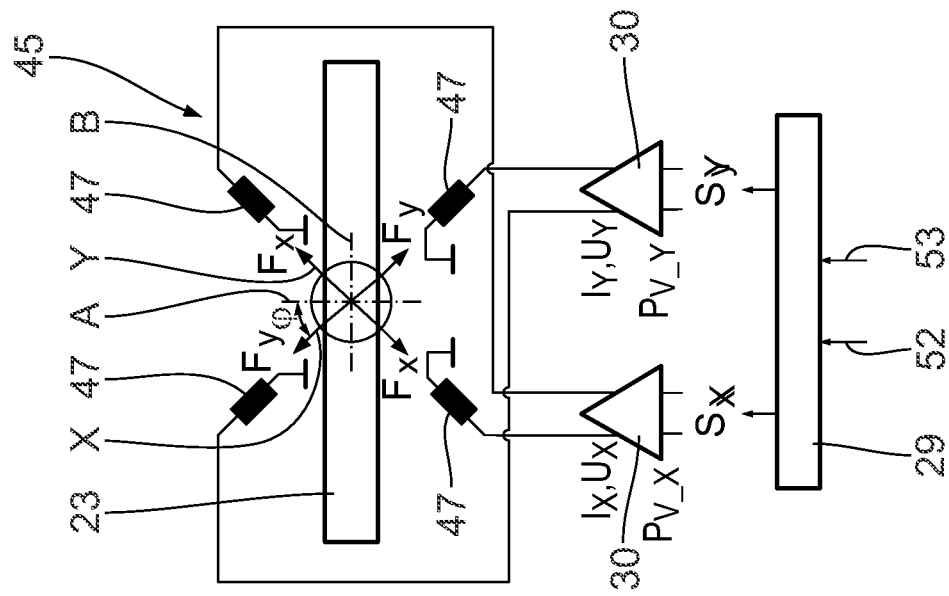
FIG. 4 shows an illustration in accordance with FIG. 3 with an arrangement of the actuators in which the actuation axes are rotated relative to the rotation axes of the mirror.
Figure 3:
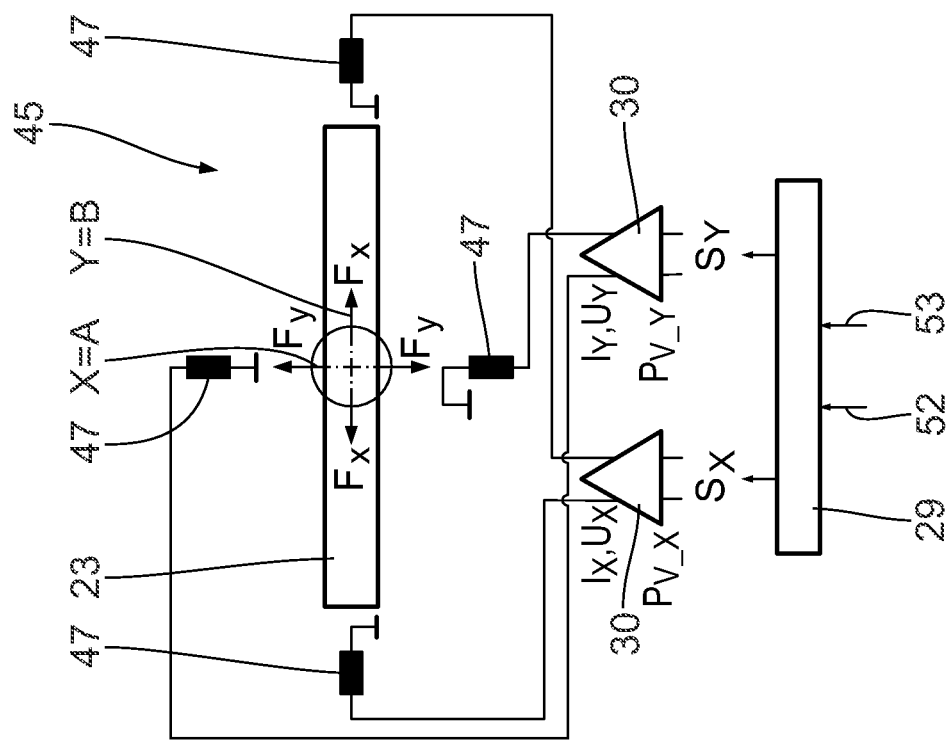
FIG. 3 shows a schematic illustration for elucidating the actuator principle in the case of a displaceable mirror with electromagnetic actuators.

In accordance with the variant illustrated in FIGS. 3 and 4, the actuator device 45 includes electromagnetic actuators 47, in particular in the form of Lorentz actuators or reluctance actuators.

The individual mirror 23 has rotation axes A, B. The individual mirror 23 is pivotable about the rotation axes A, B.

The actuators 47 define actuation axes X, Y. In the exemplary embodiment illustrated in FIG. 3, the actuation axes X, Y are identical to the rotation axes A, B of the individual mirror 23. The actuation axis X coincides with the rotation axis A. The actuation axis Y coincides with the rotation axis B.

The actuators 47 are drivable in each case via separate amplifier stages 30. The amplifier stages 30 are correspondingly also designated as X-driver amplifiers and Y-driver amplifiers. Their respective power consumption is illustrated schematically as $P_{V\_X}$ and $P_{V\_Y}$, respectively, in FIGS. 3 to 7. The total power consumption $P_{tot}$ of the driver amplifiers 30 of the actuators 47 of the individual mirror 23 which predefine the displacement position or the displacement path of the individual mirror 23 results from the sum of the power consumptions $P_{V\_X}$ and $P_{V\_Y}$ of the individual driver amplifiers 30, $P_{tot}=P_{V\_X}+P_{V\_Y}$.

The controllable electric currents provided for actuating the actuators 47 are illustrated schematically as $I_X$ and $I_Y$, respectively, and the corresponding electrical voltages as $U_X$ and $U_Y$, respectively.

The driver amplifiers are connected to the control device 29 on the input side. They receive, in particular, control or driver signals $S_X$ and $S_Y$ for the actuation directions X and Y, respectively.

On the input side, the control device 29 can be supplied with the setpoint values for the displacement positions of the individual mirror 23 via a first signal input 52.

On the input side, the control device 29 can be supplied with the actual values of the displacement positions of the individual mirror 23 via a second signal input 53. The control device can therefore be a regulating device, in particular.

Application of an electric current $I_X$ and an electrical voltage $U_X$ to the X-actuator leads via the forces $F_X$ to a moment $M_X$ in the x-direction, which leads to a rotation $R_X$ of the individual mirror 23 about the actuation axis X.

Application of an electric current $I_Y$ and an electrical voltage $U_Y$ to the Y-actuator leads via the forces $F_Y$ to a moment $M_Y$ in the y-direction, which leads to a rotation $R_Y$ of the individual mirror 23 about the actuation axis Y.

In the case of the exemplary embodiment illustrated in FIG. 4, the actuation axes X, Y no longer correspond to the rotation axes A, B of the individual mirror 23. The actuators 47 are oriented in such a way that the actuation axes X, Y are rotated by an angle φ>0 relative to the rotation axes A, B of the individual mirror 23. In the case of the exemplary embodiment illustrated, the angle φ between the actuation axis X and the rotation axis A is depicted. The absolute value of the angle φ is in particular in the range of 0° to 90°, in particular in the range of 1° to 45°, in particular in the range of 5° to 30°. It can be in particular greater than 10°, in particular greater than 20°.

Via a pivoting of the actuation axes X, Y relative to the rotation axes A, B of the individual mirror 23 and/or a pivoting of the actuation axes X, Y relative to one another, it is possible to influence the total power demand $P_{tot}$ required for displacing the individual mirror 23 into a specific displacement position.

The actuation axes X, Y can be oriented perpendicularly to one another. They can also form an acute angle. Provision can also be made for providing more than two actuators for displacing the individual mirror 23. The actuators have in particular actuation axes which are arranged in a common plane. The actuation axes of the actuators intersect in particular at a single point.

As a result of the orientation of the actuation axes X, Y relative to the rotation axes A, B, in particular the required peak power and/or the power loss, in particular the average power loss, during the shifting of the individual mirrors 23, in particular of the overall system during the actuation of the individual mirrors 23, can be reduced, in particular minimized. For this purpose, an optimization method can be provided, which is described in even greater detail below.

Figure 5:
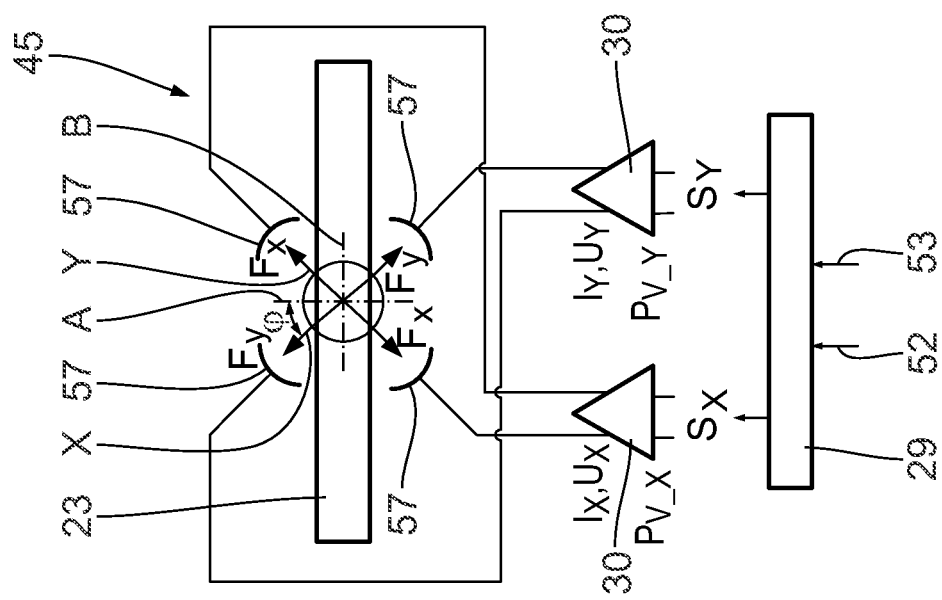
FIG. 5 shows an illustration in accordance with FIG. 4 of a component with electrostatic actuators.

The embodiment illustrated schematically in FIG. 5 corresponds to that in accordance with FIG. 4, electrostatic actuators 57 being provided instead of the electromagnetic actuators 47.

Figure 6:
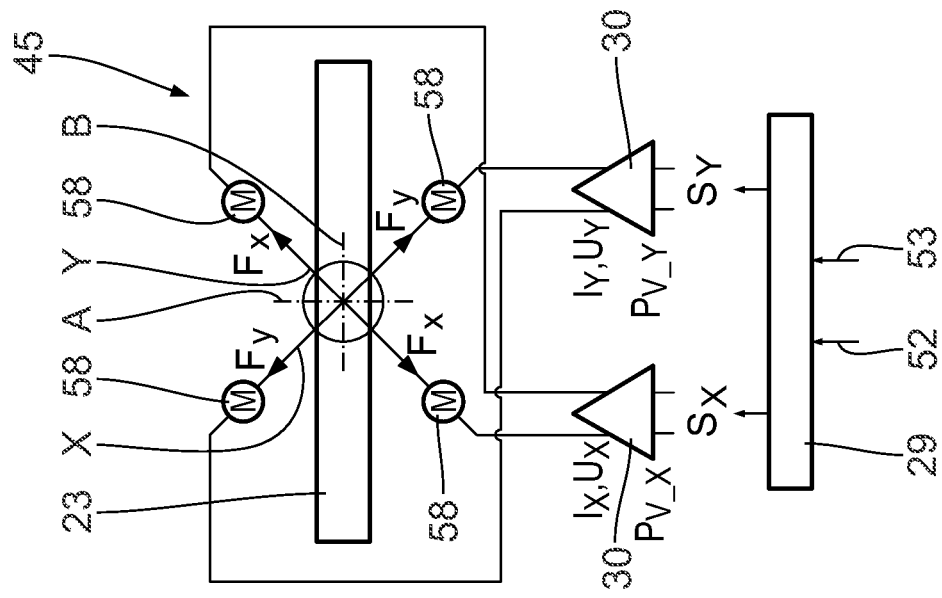
FIG. 6 shows a generalized illustration of the variants in accordance with either of FIGS. 4 and 5.

The embodiment illustrated schematically in FIG. 6 corresponds to that in accordance with FIG. 4, actuators 58 that are not specified in any greater detail being provided instead of the electromagnetic actuators 47. The actuators 58 can be arbitrary, electrically actuatable actuators 58.

In other words, the variants illustrated in FIGS. 4 and 5 are special cases of the general embodiment illustrated in FIG. 6.

Figure 7:
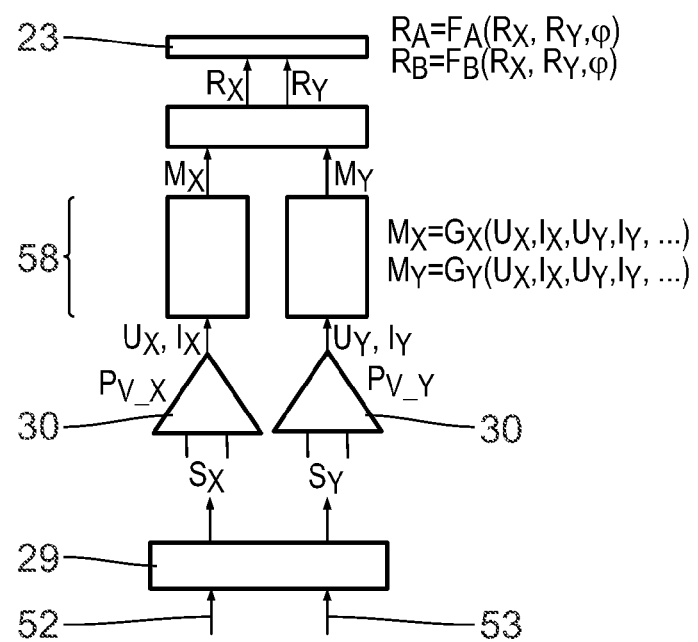
FIG. 7 shows a generalized illustration of the actuator principle, wherein mechanical and electromagnetic coupling mechanisms are illustrated schematically.

A generalized illustration of the actuator principle together with an illustration of the mechanical and electromagnetic coupling mechanisms is illustrated schematically in FIG. 7. The moments $M_X$, $M_Y$ acting on the individual mirror 23 are functions $G_X$ and $G_Y$, respectively, of the currents $I_X$, $I_Y$ and voltages $U_X$, $U_Y$ provided by the driver amplifiers 30 and also, if appropriate, of further physical variables. The electromagnetic coupling can be taken into account in the function expressions G.

The mechanical coupling, which is to be taken into account in the rotation $R_A$ and $R_B$ relative to the rotation axes A and B, respectively of the individual mirror 23, is mapped by the functions $F_A$ and $F_B$, respectively. The functions $F_A$ and $F_B$, respectively can be dependent in particular on the angle $\phi$.

Further possibilities for reducing, in particular minimizing, the power loss of the overall system, or increasing, in particular maximizing, the usable mechanical power consist in orienting the individual mirrors 23 and/or the actuator devices 45 thereof and/or adapting the orientation thereof to one another in a targeted manner. Provision can be made, in particular, for orienting the actuators 58 of the individual mirrors 23 in such a way that the direction in which the maximum mechanical power is required coincides with the minimum relative total power loss of the ensemble of the associated driver amplifiers 30 (relative to the maximum mechanical power). This can be achieved in particular via a suitable arrangement of the actuators 58 relative to the respective individual mirror 23.

Provision can also be made for orienting the actuators in such a way that the minimum relative total power loss of the ensemble of the driver amplifiers 30 (relative to the required active power) coincides with the most frequent direction of movement of the individual mirrors 23. In this case, the actuation direction is predefined by the at least two actuators 58. Via the spatial orientation of the individual mirror 23 relative to the actuators 58, this results in the direction of movement thereof during a driving of the actuators 58. Depending on the choice of the displacement positions to be set for the optical component, it may be the case that specific directions of movement occur or are required more frequently than others.

A further possibility consists in orienting the actuators 58 in such a way that the lowest stiffness of the actuators 58, in particular the lowest total power demand of the associated amplifier stages 30, coincides with the most frequent direction of movement of the individual mirror 23.

Various aspects of a method for displacing the individual mirrors 23 are described below. Generally, the individual mirrors 23 in each case form a mechanical device in the form of an optical component. They have in each case at least two degrees of freedom of displacement, in particular at least two degrees of freedom of tilting. They are displaceable into different displacement positions via an actuator device 45, in particular via at least two actuators 58. The actuator device 45 can include further parts. It can include in particular a control or regulating circuit. It includes in particular further electronic parts. Generally, the individual mirrors 23 as mechanical components together with the associated actuator devices 45 as electronic components form a mechatronic system.

For displacing or positioning one of the individual mirrors 23 into a specific displacement position, the actuators 58 associated with the individual mirror 23 are activated via associated amplifier stages 30. The amplifier stages 30 are connected to a control device 29 in a signal-transmitting manner. The amplifier stages 30 can form a part of the actuator device 45.

For general details of the displacement of the individual mirrors 23, reference should be made to DE 10 2011 007 917 A1, which is hereby integrated into the present application as part thereof.

The amplifier stages 30 can be embodied in particular as part of the ASIC 27. They can also be embodied separately from the ASIC 27.

The control device 29 is preferably embodied separately from the ASIC 27. It can be embodied in particular separately with respect to the optical assembly 25. It is connected to the optical assembly 25 in particular via an interface 31.

The control device 29 can also be at least partly integrated into the ASIC 27.

For displacing the individual mirror 23 into a specific displacement position, a specific electrical power $P^i$ is in each case provided for the amplifier stages 30 associated with the individual mirror 23. The total power $P_{tot}$ to be provided, which corresponds to the sum of the electrical powers $P^i$ of the amplifier stages 30 associated with the individual mirror 23, is dependent on the displacement position of the individual mirror 23. In other words, there are at least two different displacement positions of the individual mirror 23 in which the sum $P_{tot}$ of the power consumptions $P^i$ of the associated amplifier stages 30 differs from one another. In other words, there is at least one position in which the electrical power consumption of the overall system is higher than in other positions. Since the displacement position and direction are also determined by the signs of current and/or voltage which are output by the amplifier stages 30, the same total power $P_{tot}$ can result even for different current/voltage configurations, even though different displacement positions are established on account of different signs of current and voltage. In other words, different displacement positions can be associated with an identical electrical power consumption $P_{tot}$ of the overall system.

It has been recognized that the different displacement positions which are associated with an identical electrical power consumption of the overall system lie on closed curves or—in the case of more than two actuators—on closed areas. The displacement trajectories, in particular the ensemble of the displacement trajectories, can preferably be chosen in such a way that the displacement trajectories, in so far as possible, run along such an isoline or isosurface. The displacement trajectories can be chosen in particular in such a way that they run within the region which is delimited by the two isocurves or isosurfaces which are predefined by the end points of the displacement trajectory. It is also possible to specify a maximum value by which the displacement trajectories are permitted to be separated from this—generally higher-dimensional—region.

A displacement position of the individual mirror 23 which requires a minimum total electrical power $P_{min}$ is also designated hereinafter as zero position 36. The zero position 36 is given in particular by the mechanical properties of the mounting of the individual mirror 23, in particular of the articulated body 21. The zero position 36 is adopted in particular if none of the actuators 58 is actuated, i.e. if the total power consumption $P_{tot}$ of the amplifier stages 30 is identical to 0, $P_{tot}=0$.

The total electrical power $P_{tot}$ required for displacing the individual mirror 23 into a specific displacement position is dependent in particular on the distance between the displacement position and the zero position 36, in particular on the absolute value of the tilting angle, and/or on the direction of the displacement, in particular the tilting.

For positioning or displacing the individual mirrors 23, the associated actuator devices 45, in particular the associated actuators 58, are activated in a controlled manner. For driving the individual actuator devices 45, a current intensity $I^i$ and a voltage $U^i$ are applied to each of the actuator devices, in particular the amplifier stage 30 thereof. The instantaneously interrogated electrical power $P^i$ results from the product of the current intensity and the voltage $U^i$, $P^i=I^i \cdot U^i$. The interrogated power $P^i$ is thus a result of the set values of current $I^i$ and voltage $U^i$. The total power $P_{tot}$ interrogated for positioning or displacing one of the individual mirrors 23 then results as the sum of the powers $P^i$ of all the actuators 58 of the individual mirror. In particular the peak powers $P^i_{max}$ of the actuator devices 45, in particular the total peak power $P_{tot\ max}$, and also an averaged power loss, in particular a time-averaged power loss, are relevant to the design of the mechatronic system. In this case, the power loss indicates the difference between the electrical power interrogated by the actuator devices 45 and the mechanical active power.

A maximum electrical power, $P_{max}$, is available for positioning or displacing the individual mirror 23. The maximum available electrical power $P_{max}$ is limited, inter alia, by the number and/or embodiment thickness of the electrical supply lines 32 to the actuator devices 45.

It has been recognized according to the disclosure that a so-called worst-case design with regard to the available power, i.e. a design of the mechatronic system, in particular of the number and/or embodiment thickness of the electrical supply lines, in such a way that all the actuator devices 45, in particular the amplifier stages 30 thereof, can simultaneously call up the maximum electrical power $P^i_{max}$, is not absolutely necessary and leads to an overdimensioning of the mechatronic system, in particular of the number and/or embodiment thickness of the electrical supply lines, i.e. to an unnecessary waste of space. The present disclosure makes it possible to reduce the number and/or embodiment thickness of the electrical supply lines. This leads to a simplified mechanical system design. Moreover, it is thereby possible to improve the purity in the evacuated system.

By applying one of the methods—described in greater detail below—for displacing at least one of the individual mirrors 23, in particular for displacing all the individual mirrors 23, of the optical assembly 25, it suffices to design the mechatronic system in such a way that a maximum possible power consumption of all the actuator devices 45, in particular of the amplifier stages 30 thereof, is at most equal in magnitude to a predefined maximum power $P_{max}$ which is less than the sum S of the maximum powers $P^i_{max}$ of all the actuator devices 45, $P_{max}<S$. The optical assembly 25 is designed in particular in such a way that the following holds true:

$P_{max}$: $S \leq 0.9$, in particular $P_{max}$: $S \leq 0.8$, in particular $P_{max}$: $S \leq 0.7$, in particular $P_{max}$: $S \leq 0.6$, in particular $P_{max}$: $S \leq 0.5$.

In order to reduce the power consumption of the individual actuator devices 45, the amplifier stages 30 can be embodied in each case as an amplifier having an efficiency of at least 70%, in particular at least 80%, in particular at least 90%. The amplifier stages 30 can be embodied in particular as switching or class-D amplifiers.

Moreover, the required electrical power can be reduced via mechanical concepts, in particular via a suitable mounting of the individual mirrors 23.

The design according to the disclosure of the power supply of the actuator devices 45 also has the consequence, inter alia, that the design of the heat dissipation for the power loss can be simplified.

The exemplary embodiments described below can be realized in each case by themselves or else in combination with one another.

One exemplary embodiment of a method for displacing at least one of the individual mirrors 23 is described below with reference to FIGS. 8 and 9. As is illustrated by way of example in FIGS. 8 and 9, the positioning of one of the individual mirrors 23 requires a position-dependent activation of the actuator devices 45. It therefore requires in particular a position-dependent power consumption of the respective actuator devices 45.

Figure 8:
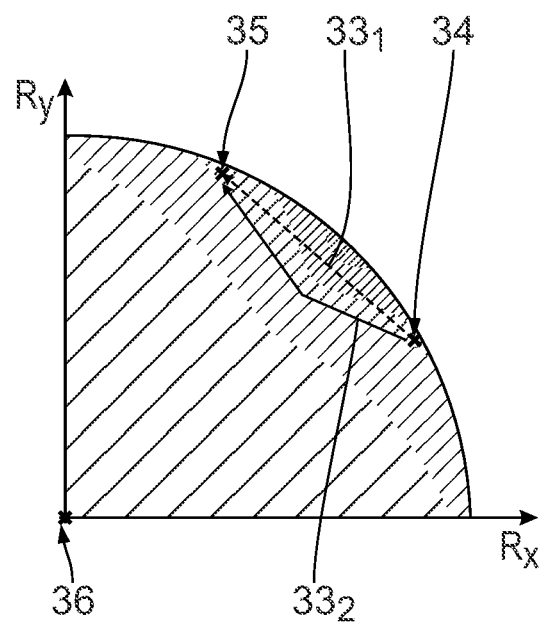
FIG. 8 shows an illustration of a position-dependent power consumption of the actuator amplifiers and a possible displacement trajectory for the displacement of the mirror from a first position into a second position.
Figure 9:
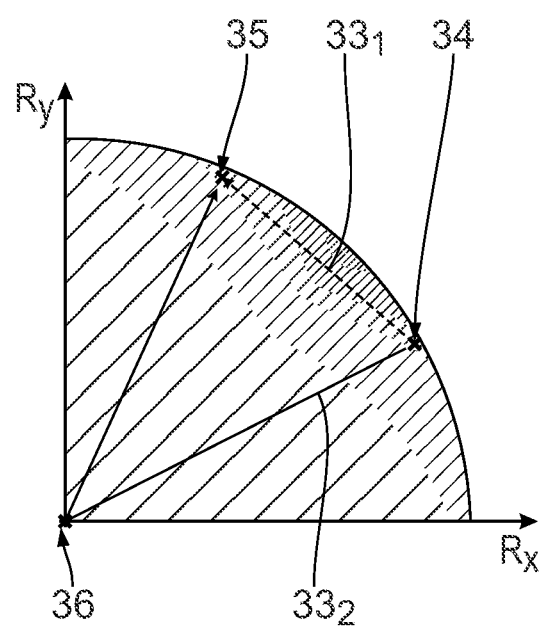
FIG. 9 shows an illustration corresponding to FIG. 8 with an alternative displacement trajectory, FIG. 10 schematically shows a power-deflection diagram in the case of a change of the displacement position in a system without hysteresis correction.

FIGS. 8 and 9 illustrate by way of example in each case a total power consumption $P_{tot}$ of the actuator devices 45 that is required for positioning one of the individual mirrors 23, wherein the two axes indicate in each case a measure of the rotation $R_x$, $R_y$ of the individual mirrors 23 about the respective actuation axes x, y, which rotation is brought about by the activation of the actuators 58. For clarification, ranges of increasing total power consumptions are identified by increasingly denser hatchings. FIGS. 8 and 9 should be understood to be by way of example. The generally multi-dimensional landscape of the total power consumption associated with the different displacement positions of the individual mirrors 23 can also assume a different form from that illustrated in FIGS. 8 and 9.

For the sake of simplicity, FIGS. 8 and 9 illustrate a positioning of one of the individual mirrors 23 in an x-y-plane, a respective actuator being used for the deflection in the x- and y-directions. The total electrical power $P_{tot}$ is particularly high on account of the actuation principle for positions in the diagonal between the x- and y-axes.

As is illustrated by way of example in FIGS. 8 and 9, the individual mirror 23 can be displaced along different displacement paths $33_1$, $33_2$ from a first displacement position 34 into a second displacement position 35. The displacement trajectory $33_1$ represents, in particular, the direct connection between the first displacement position 34 and the second displacement position 35. The disclosure provides for displacing the individual mirror 23 not along the displacement trajectory $33_1$, but rather along a different displacement trajectory, in particular the displacement trajectory $33_2$.

Generally, it is also possible to provide more than two actuators 58 for the displacement of the individual mirrors 23. The displacement trajectories 33 generally run in an at least two-dimensional space representing the total power consumption of the actuator devices. The space can also be higher-dimensional. Particularly during the displacement of a plurality of individual mirrors 23, the displacement trajectory 33 can represent the displacement of all the individual mirrors 23. The aspects described are likewise applicable to this case.

The disclosure provides for choosing the displacement trajectory 33 in such a way that it avoids as far as possible regions which can be reached only with a high total power $P_{tot}$. Provision is made, in particular, for driving the actuator devices 45, in particular the actuators 58, in such a way that, during the displacement of the individual mirror 23 from the first displacement position 34 into the second displacement position 35, the actuation directions brought about by the individual actuator devices 45, i.e. the displacement paths brought about by the individual actuator devices 45, are not chosen independently of one another, but rather are coordinated with one another such that the common electrical power consumption of the actuator devices 45 used is reduced, in particular a minimum, during the position change. The displacement trajectories 33 are adapted in particular to a predetermined maximum value $P_{max}$ of the total power consumption. To put it illustratively, the predefinition of the maximum value $P_{max}$ defines regions in the abstract space representing the total power consumption of the actuators 58 which are not permitted to be traversed by the displacement trajectories 33. The displacement trajectories 33 can be optimized in particular with regard to the total power $P_{tot}$ to be provided.

When adapting the displacement trajectories 33, it is also possible, in particular, to take account of the mechanical details of the mounting of the element to be displaced, in particular of the individual mirrors 23. The displacement trajectory 33 can be chosen in particular such that as little force or power as possible need be applied on the path from the first displacement position 34 into the second displacement position 35.

It can be particularly advantageous, as illustrated in FIG. 9, to pass through the zero position 36 during the displacement from the first displacement position 34 into the second displacement position 35. The zero position 36 requires the minimum power consumption. In other words, the displacement trajectory 33 can be chosen in such a way that it leads through the zero position 36.

Provision can be made for briefly residing in the zero position 36, i.e. for momentarily interrupting the displacement. This can be used to compensate for or correct a hysteresis. A stable position regulation can be significantly simplified as a result.

If the power-deflection characteristic (P-R characteristic curve) of the actuator device 45 has a hysteresis, then without the compensation of the hysteresis in the zero position 36, at which P=0 W holds true, the current to be generated for the deflection into the second displacement position 35 is dependent not only on the second displacement position 35, but also on the preceding first displacement position 34 and the requisite power consumption of the actuators 58 of the respective actuator device 45. This is illustrated by way of example and schematically in FIG. 10, in which $R_{1a}$, $R_{1b}$ identify two different starting positions and $P_{1a}$, $P_{1b}$ identify the electrical power respectively required for setting the starting positions, whereas $R_{2a}$, $R_{2b}$ and $P_{2a}$, $P_{2b}$ identify an identical target position and the electrical powers required for setting the target position.

The abovementioned dependence of the power consumption on the first displacement position 34 ($=R_1$) requires a complex regulation of the static and dynamic deflection of the actuators 58, particularly if the peak power of the overall system is intended to be reduced by an optimized actuation. In this case, a dynamic deflection should be taken to mean the change between static deflections.

By compensating for the hysteresis in the zero position 36, it is possible to considerably simplify the regulation of the static and dynamic deflection of the actuators 58 by ensuring that the power $P_2$ to be set for the target position $R_2$, i.e. the second displacement position 35, through the actuators 58 is independent of the previous displacement position 34 thereof. That can be achieved by virtue of the fact that, during the change between in each case two static deflections, i.e. between two displacement positions 34, 35, each actuator is always initially regulated back to the zero position 36 where R=0 and P=0 W, before the then fixedly defined power P is set for the target position $R_2$. In this case, regulation back to the zero position 36 can be effected by adjustment of R=0 and subsequent reduction of the power to P=0 W. This is illustrated schematically in FIG. 11 for the examples illustrated in FIG. 10.

Figure 10:
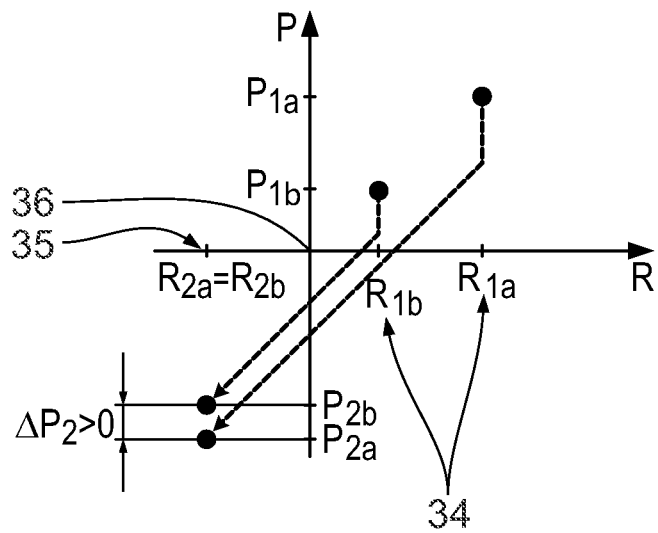
Figure 11:
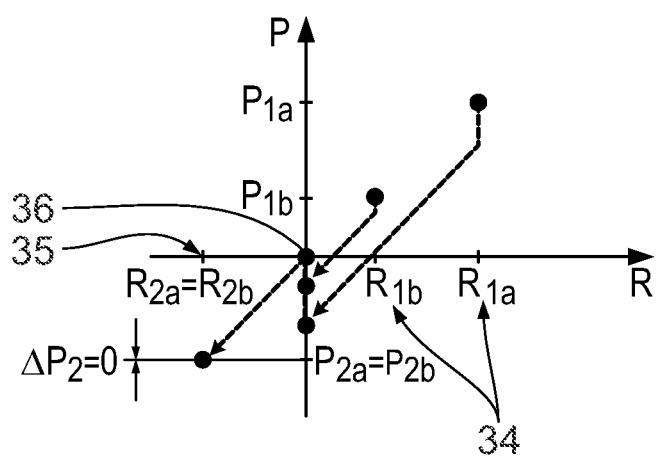
FIG. 11 shows an illustration corresponding to FIG. 10 in the case of a system with hysteresis correction.

As is qualitatively evident from FIGS. 10 and 11, the power P to be set for the target position $R_2$ with correction of the hysteresis in the zero position 36 is lower than without hysteresis correction. In other words, the hysteresis correction additionally affords the advantage of further reducing the peak power and power loss of the overall system. The hysteresis compensation leads in particular to a reduction of the required peak power. It leads in particular to a reduction of the power loss of the overall system.

Moreover, in the zero position 36, which is in particular unambiguous and/or reproducible, it is also possible, inter alia, to calibrate, in particular recalibrate, the sensors 28 used for the position regulation of the individual mirror 23.

Figure 12:
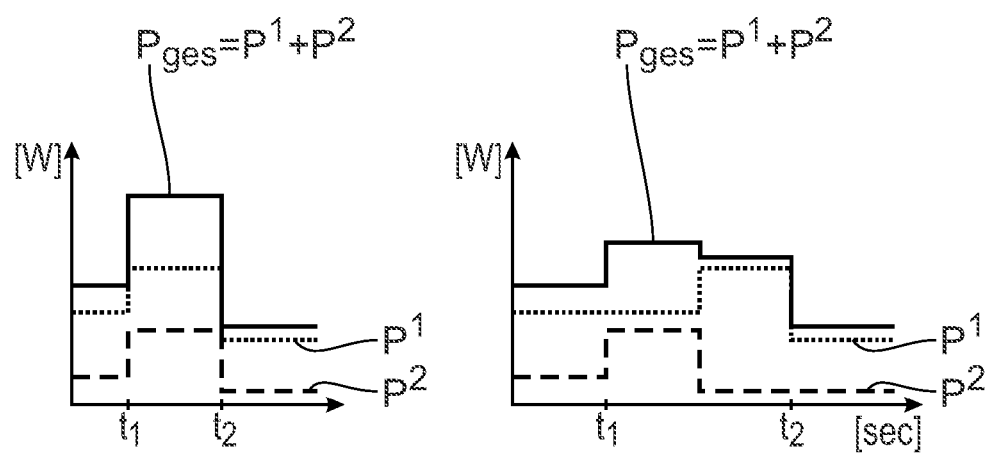
FIG. 12 shows a schematic illustration of the power consumption of the actuators of a displaceable mirror.

A further possibility for reducing the total power $P_{tot}$ to be provided is illustrated in FIG. 12. FIG. 12 illustrates the individual power consumption $P^i$ of two actuators 58 and also the associated total power consumption $P_{tot}=P^1+P^2$. Moreover, the start time $t_1$ and end time $t_2$ of the displacement process are in each case indicated by way of example in FIG. 12.

As is illustrated in the left-hand half of FIG. 12 a temporally parallel, i.e. a synchronized, activation of the actuators 58 leads to a particularly high total power $P_{tot}$. In accordance with the exemplary embodiment illustrated in FIG. 12, right-hand side, provision is therefore made for driving the actuators 58 for displacing the individual mirror 23 in a temporally interleaved manner, for example also completely sequentially. As a result, the peak value of the total power $P_{tot}$ can be reduced in comparison with a simultaneous actuation. This possibility also includes a procedure in which the displacement trajectories 33 of the actuated individual mirrors 23 are subdivided into a plurality of partial sections. The partial sections can then be suitably combined in order to reduce the peak value of the total power $P_{tot}$.

This exemplary embodiment can particularly advantageously be combined with the preceding exemplary embodiment described. The sequential driving of the actuators 58 can be advantageous particularly if the displacement trajectory $33_2$ cannot lead through the zero position 36, but rather follows a shorter path, on account of temporal maximum predefinitions for the displacement.

A further exemplary embodiment is described below with reference to FIG. 13. If the individual mirror 23 is kept stationary in the first displacement position 34 at least for a short time, static friction effects can occur at the beginning of a displacement process. Such static friction effects can have a direction dependence. In accordance with the method illustrated in FIG. 13, provision is therefore made for choosing the displacement trajectory $33_2$ in such a way that it points in a direction of minimum static friction 37 at the beginning of the displacement process, i.e. in the first displacement position 34. A direction-dependent stiffness of the mounting of the individual mirror 23 can also be exploited in this case. As a result, once again the required electrical power, in particular at the beginning of a displacement process, is thereby reduced, in particular minimized.

The direction dependence of the static friction can be determined beforehand by experiments or measurements. It can be stored in a system-internal memory, for example. It is possible to store in the memory in particular the measurement values for the measured directions and/or the derivations thereof or a numerical model which was ascertained from the measurement values and which allows the calculations of the static friction during the operation of the system for arbitrary start directions of the actuation.

The displacement trajectory $33_2$ can point in the direction of the zero position 36 in particular in the first displacement position 34. This is advantageous particularly if the individual mirror 23 and/or the associated actuator electrodes 24 is/are oriented in such a way that the maximum restoring force always points in the direction of the zero position 36. In this case, the direction of minimum static friction 37 also points in the direction of the zero position 36.

Figure 13:
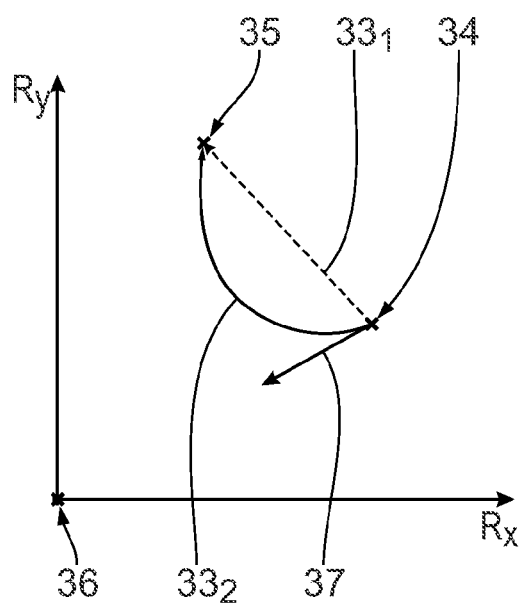
FIG. 13 shows a schematic illustration for elucidating the adaptation of the displacement trajectory to the mechanical properties of the mirror to be displaced.

As is illustrated by way of example in FIG. 13, the displacement trajectory $33_2$ can be embodied as curved. It can have a constant radius of curvature, in particular.

A further possibility for reducing the total power $P_{tot}$ during the displacement of the individual mirrors 23 consists in the local storage of electrical energy and/or kinetic energy at at least one actuator 58. This energy can be recovered, in particular reused, during a position change of the actuated mechanical element, in particular of the individual mirror 23. It can be reused in particular in the same and/or in other actuators 58 of the system.

A storage device 59 serves for storing electrical energy. The storage device 59 includes one or a plurality of local capacitors 56, for example.

The recovery of the energy can be achieved for example by capacitor discharge and/or by voltage induction, in particular at coils.

Figure 20:
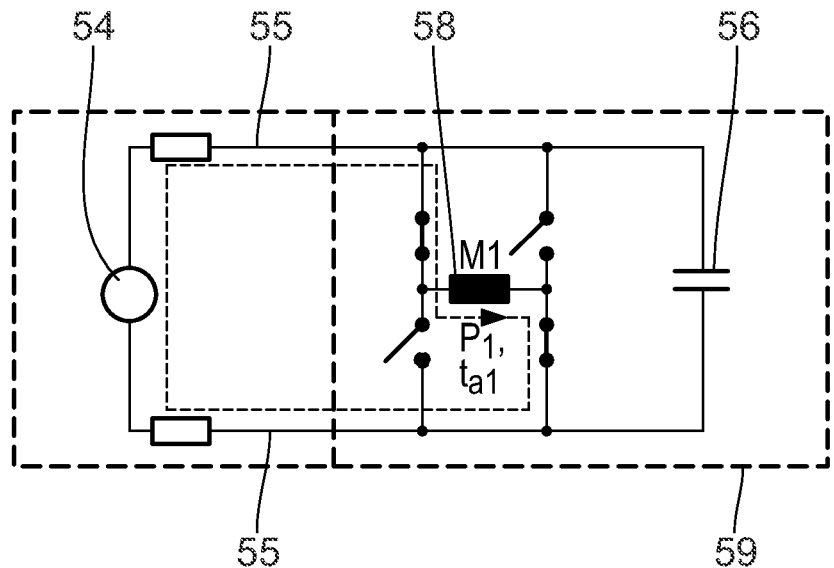
FIG. 20 shows a schematic illustration of a circuit realization for an embodiment variant with pulse-width-modulated actuator driving in a first switch position.
Figure 21:
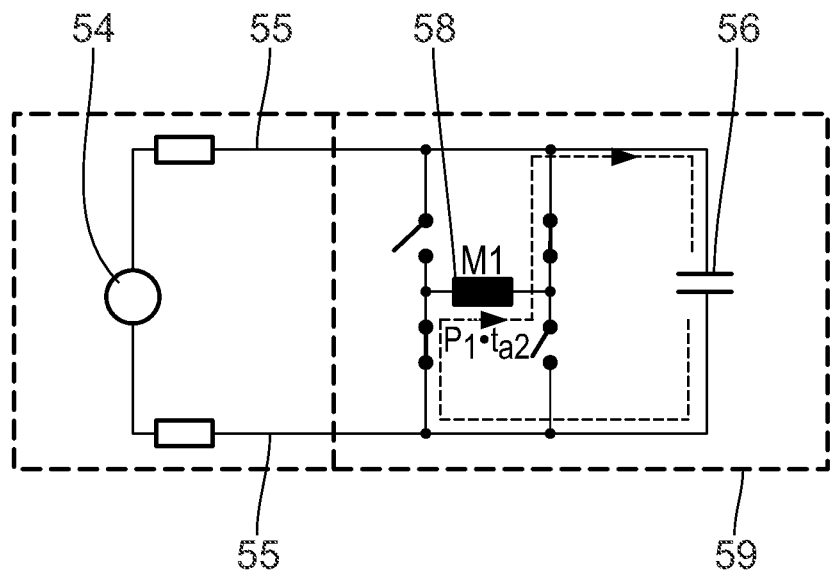
FIG. 21 shows a schematic illustration of the circuit in accordance with FIG. 20 in a second switch position.

An embodiment in which the local storage of electrical energy is used for reducing the peak electrical power required is illustrated in FIGS. 20 and 21. A pulse-width-modulated (PWM) actuator driving is provided in the case of this variant. In the case of such driving, an average power consumption of the actuator 58 is realized by periodic supply and removal of energy. The average power can be controlled by the control of the supply periods and removal periods. If this supply and removal is realized solely via an external voltage source 54, on account of the power loss in the electrical supply lines 55 the resulting peak power is higher than if locally stored energy can be reused for the actuation. The disclosure therefore provides for part of the energy provided for the actuation to be stored locally for the purpose of reducing the peak power. The storage of energy can be effected, for example, by virtue of the fact that the energy supplied to the actuator 58 by the external voltage source 54 in an actuation interval $t_{a1}$ (illustrated in FIG. 20) is not returned to the voltage source 54, but rather is removed into a local storage capacitor 56. This is the case for the switch position illustrated in FIG. 21. The energy stored in the capacitor 56 can then be made available either to the same actuator 58 or else—via a switching network—to other actuators 58 in a subsequent actuation interval $t_{a2}$.

As a result of a parallel connection of a plurality of the actuators 58 and associated switches on the supply lines 55 and the use of a common storage capacitor 56, it is possible to realize the described reuse—illustrated below in FIG. 18—of electrical energy between at least two actuators 58.

Via constructive superposition of the energy uptake and release of at least two actuators 58, as much energy as possible can be kept in the system, which makes it possible to reduce the power loss on electrical supply lines. One exemplary example of the energy demand of two actuators $E_{A1}$, $E_{A2}$ for displacing an individual mirror 23 before, during and after a position change is illustrated by way of example in the topmost line in FIG. 18.

Figure 18:
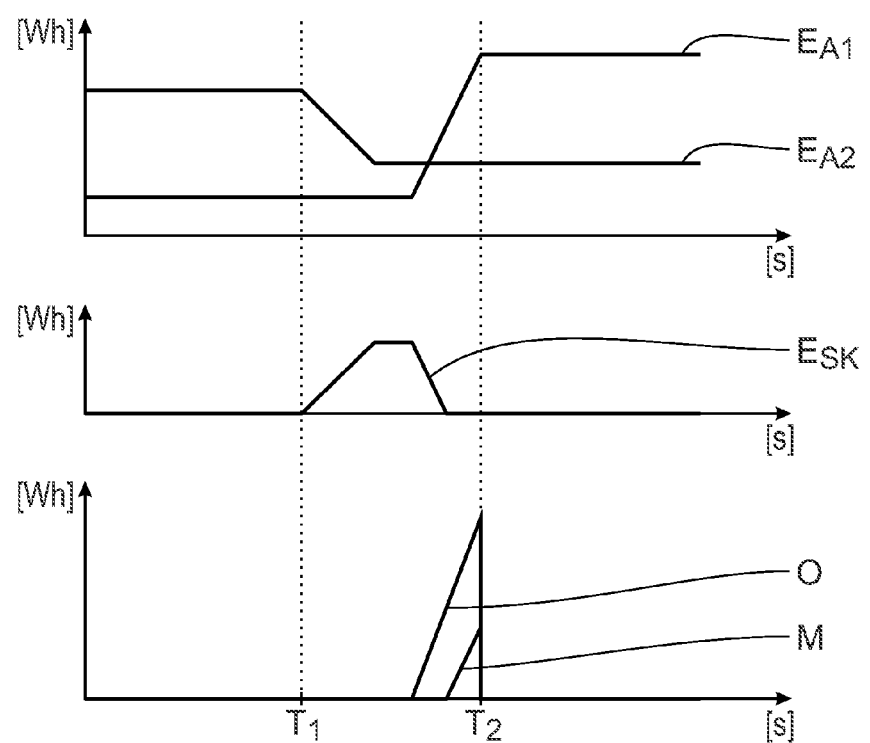
FIG. 18 shows schematic diagrams which illustrate the energy demand of two actuators during a position change and also the energy that can be stored in a storage capacitor during this position change and the overall energy to be fed externally during this position change.

The top line in FIG. 18 schematically illustrates the energy demand of two actuators $E_{A1}$, $E_{A2}$ in arbitrary units before, during and after the position change.

In this case, the individual mirror 23 to be displaced is situated in a first displacement position 34 until the instant $T_1$, is thereupon displaced into a second displacement position along a displacement trajectory 33 in the interval $[T_1, T_2]$ and is subsequently kept in the second displacement position.

The middle line in FIG. 18 schematically illustrates the energy $E_{SK}$ stored in a storage capacitor 56 during the position change.

The bottommost line in FIG. 18 illustrates, as curve O, the energy to be supplied externally in the case of a system without a storage capacitor and, as curve M, the corresponding quantity of energy in the case of a system with a storage capacitor 56. In this case, for the sake of simplicity, it is assumed that the entire energy stored in the storage capacitor 56 (see middle line in FIG. 18) is reusable.

In order to minimize the power loss further, in this case it is also possible, for example, to suitably vary and/or combine the current flow direction and/or the voltage polarity at the actuators 58.

One possible realization of this concept consists in the use of a storage capacitor 56 in each case for a group of actuators 58 for which a different total energy is to be kept available, i.e. provided, at at least two different displacement positions. In the case of a position change, the energy to be provided can then be transferred from one actuator 58 of the group to another. This variant is illustrated schematically for a system having two actuators 58 in FIG. 18.

In accordance with a further variant, it is provided that the actuators 58 of the system, in contrast to the illustration shown by way of example in the top line in FIG. 18, are not driven sequentially, but rather, as far as possible, simultaneously. In this case, the energy can be transferred directly from one actuator to the other.

A further possibility for reducing the total power $P_{tot}$ during the displacement of the individual mirrors 23 consists in constructively utilizing the electromagnetic crosstalk between at least two actuators. In this case, constructively should be understood in the sense of "non-destructively", i.e. with a positive benefit. This is possible in particular in the case of magnetic, inductive and capacitive actuators. The crosstalk can be utilized in particular upon a static position being held and/or in the case of temporally parallel position changes.

It is possible, in particular, to constructively utilize the electrical crosstalk of phase-matched pulse-width-modulated driver amplifier signals.

The regulation provided can be a so-called "multiple-input-multiple-output regulation" (MIMO regulation), in which a crosstalk between actuators is not necessarily reduced, rather in which the required total electrical power $P_{tot}$ is minimized. For this purpose, the parasitic power loss, for example the thermal power converted in an electromagnetic actuator shielding, can be used as active power.

In this variant, it may be expedient, for example, to deliberately dispense with an electromagnetic shielding between different actuators.

The effects of crosstalk can be determined in a model-based manner, in particular with the aid of a matrix having coupling factors.

Figure 19:
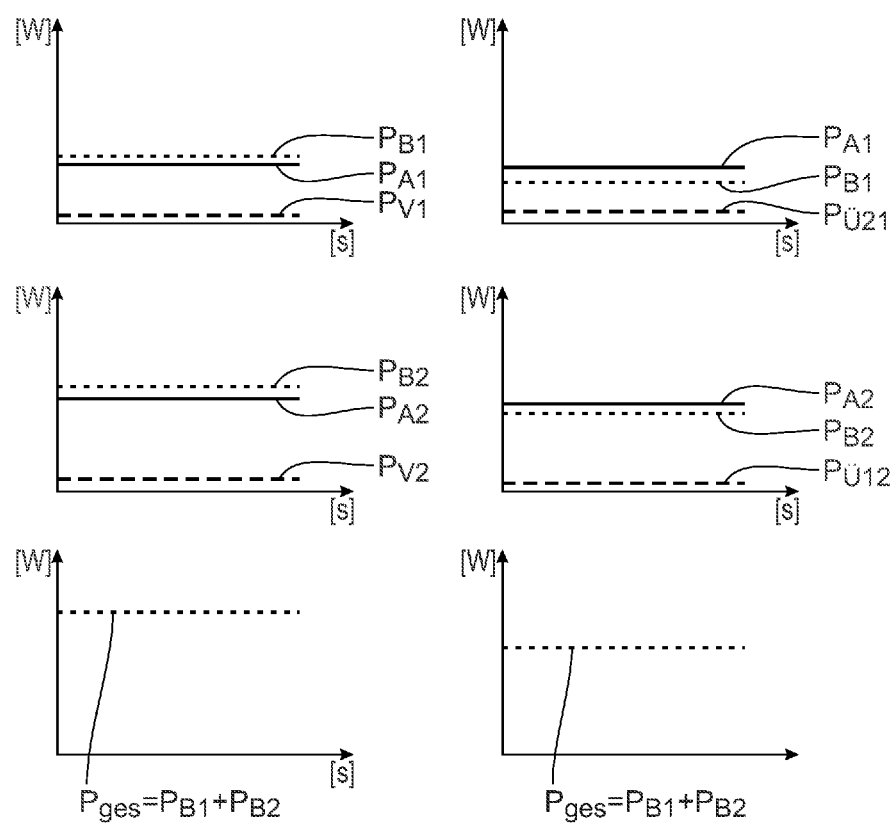
FIG. 19 shows schematic diagrams which elucidate the effect of utilizing electromagnetic crosstalk between two actuators.

The advantages of this variant are illustrated schematically in FIG. 19. While the left-hand column illustrates in each case a situation in which the crosstalk between the actuators 58 is not utilized, the right-hand column in FIG. 19 illustrates a situation in which the crosstalk between two actuators 58 is utilized. The top row in FIG. 19 illustrates an active power of a first actuator 58 with $P_{A1}$. The left-hand column additionally illustrates a parasitic power loss $P_{V1}$ and the required electrical power $P_{B1}$ of the actuator 1. The right-hand column illustrates by way of example a crosstalk power $P_{Ü21}$ from actuator 2 to actuator 1. In addition, the right-hand column likewise illustrates the overall required electrical power $P_{B1}$ of the actuator 1. It is less than the required electrical power $P_{B1}$ in the case where the crosstalk is not utilized.

The middle row illustrates the corresponding relations for the actuator 2 without and with utilization of crosstalk from actuator 1.

The bottom row in FIG. 19 illustrates in each case the total required power $P_{tot}=P_{B1}+P_{B2}$. It was possible to show that the total power $P_{tot}$ can be reduced by constructive utilization of the crosstalk between different actuators 58.

In the case of position changes, it may also be expedient to reduce, in particular minimize, the peak electrical power $P_{max}$ by driving actuators 58 temporally in parallel in the case of constructive crosstalk and temporally sequentially in the case of destructive crosstalk.

Crosstalk between the actuators 58 can be achieved by dispensing with an electromagnetic shielding or attenuating such a shielding. It was possible to show that the required peak electrical power $P_{max}$ with utilization of the crosstalk is maximally equal in magnitude with that without such utilization. The maximally required peak electrical power can be reduced, in particular, by utilization of crosstalk. The reduction can be in particular at least 1%, in particular at least 3%, in particular at least 5%, of the peak electrical power $P_{max}$ required without utilization of crosstalk.

Figure 14:
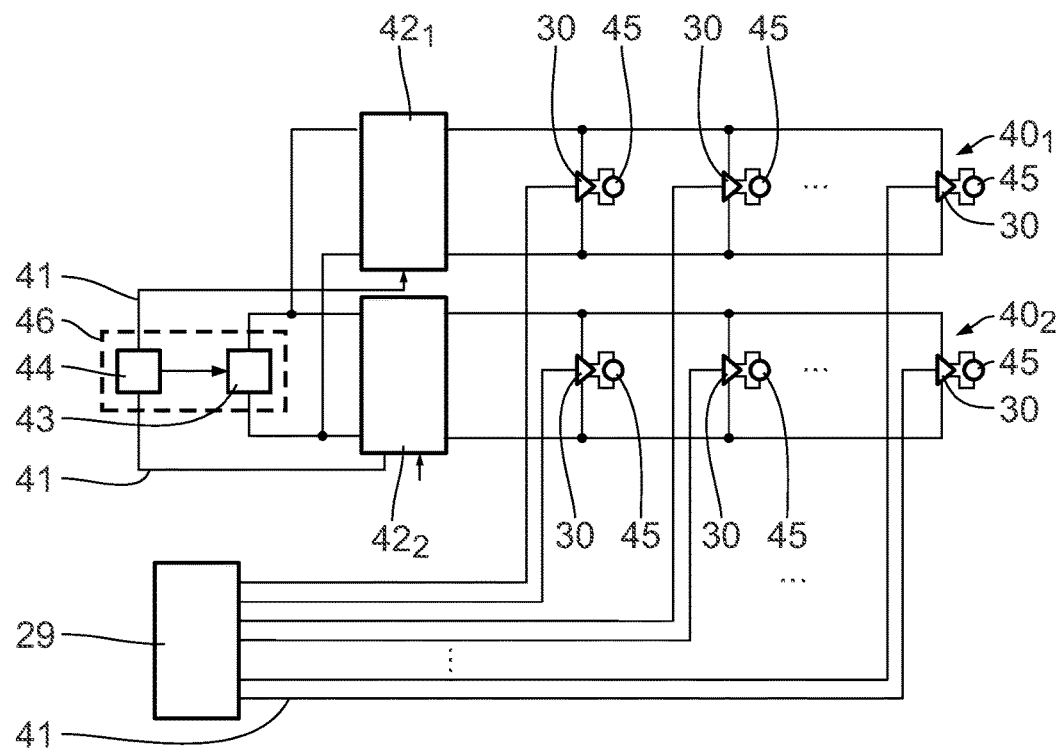
FIG. 14 shows a schematic illustration of an amplifier circuit for adaptively limiting the supply voltage of the actuator driver amplifiers.
Figure 15:
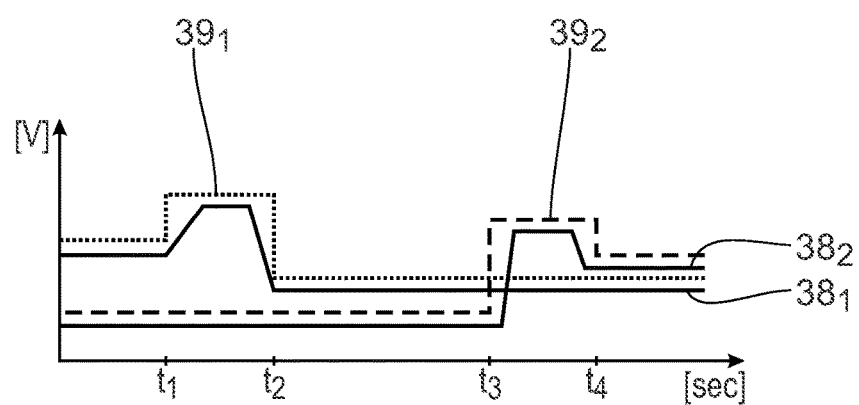
FIG. 15 shows a schematic illustration of the temporal profile of the supply voltage of the two groups of actuator driver amplifiers in accordance with FIG. 14 in the case of an adaptive regulation.

A further possibility for reducing the total power $P_{tot}$ during the displacement of the individual mirrors 23 includes an adaptive limiting of the supply voltage of the amplifier stages 30. A corresponding temporal profile of an actual supply demand $38_i$ of two groups $40_1$, $40_2$ of amplifier stages 30 and of the associated, adapted provided supply $39_i$ of the groups during the displacement of a first group of the individual mirrors 23 in a time interval $t_1$ to $t_2$ and a displacement of a further group of the individual mirrors 23 in a displacement interval $t_3$ to $t_4$ is illustrated in FIG. 15. An associated circuit concept for driving the actuators 58 of the first group $40_1$ and of the second group $40_2$ is illustrated in FIG. 14.

The groups $40_1$, $40_2$ in each case include at least one actuator 58. For each of the groups $40_1$, $40_2$, an adaptive limiting of the supply voltage is effected separately from one another. The supply voltage of each of the groups $40_1$, $40_2$ can be adaptively set for example via a regulable DC/DC converter $42_1$, $42_2$.

The totality of the individual mirrors 23 and/or of the associated actuators 58 can also be subdivided into more than two groups $40_1$, $40_2$ for which an adaptive limiting of the supply voltage is effected separately from one another.

The adaptive limiting of the supply voltage involves firstly ascertaining the maximally required supply voltage depending on the first displacement positions 34 and/or the second displacement positions 35 of the individual mirrors 23 to be displaced, i.e. on the start and/or target positions of the individual mirrors 23 to be displaced, and/or the displacement trajectories $33_2$ provided therefor.

In addition, FIG. 14 schematically illustrates the control device 29. It supplies the amplifier stages 30 via data-transmitting supply lines 41 in each case with the signals to be amplified.

Furthermore, a supply voltage source 43 and a device 44 for controlling the supply voltage of the amplifier stages 30 are provided. These are designated hereinafter jointly as supply voltage regulation 46.

The supply voltage of the amplifier stages 30 is regulated via the supply voltage regulation 46.

On the output side, the amplifier stages 30 are connected in each case to one of the actuator devices 45, in particular to the actuators 58.

The DC/DC converters $42_i$ have a high efficiency and a low large-signal bandwidth. The efficiency of the DC/DC converters $42_i$ can be in particular in the range of 90% to 95%. The large-signal bandwidth of the DC/DC converters $42_i$ should be understood here to mean the supported frequency coverage thereof with full power swing. It is less than 10 Hz, in particular. The amplifier stages 30 have in each case a low efficiency and a higher large-signal bandwidth than the DC/DC converters. The efficiency of the amplifier stages 30 without the DC/DC converters $42_i$ can be in the range of 50% to 95%.

Provision can be made, in particular, for regulating the input power of the amplifier stages 30. The supply voltage of the amplifier stages 30 can be controlled, in particular regulated, in particular in such a way that it is adapted to the output power of the amplifier stages 30. The efficiency of the amplifier stages 30 can be increased as a result. In this way, the amplifier stages 30 can be modulated better, in particular. It is possible, in particular, to maximize the modulation of the amplifier stages 30. According to the disclosure, provision can be made, in particular, for regulating the supply voltage and thus the input power of the amplifier stages 30 in such a way that the ratio of input power to output power is in the range of 0.1 to 10, in particular in the range of 0.3 to 3, in particular in the range of 0.5 to 2.

The frequency bandwidth of the amplifier stages 30 can be in particular at least 10 Hz, in particular at least 50 Hz, in particular at least 100 Hz, in particular at least 500 Hz, in particular at least 1000 Hz.

The control device 29 can also be connected to the supply voltage regulation 46 in a data-transmitting manner. Via the supply voltage regulation 46, in particular via the control device 29, it is possible to ascertain and set the supply voltage, in particular the optimum supply voltage, for the amplifier stages 30 of the groups $40_1$, $40_2$. The supply voltage is ascertained in particular depending on the predefined travel setting, i.e. the predefined displacement trajectory $33_i$.

In accordance with one particularly advantageous embodiment, illustrated schematically in FIG. 22, a multiplex method can be provided for driving the amplifier stages 30. It is thereby possible, in particular, depending on the travel setting, i.e. depending on the desired displacement trajectory $33_i$, to combine amplifier stages 30 having an identical or similar requirement made of the maximum supply voltage to form groups. In this case, the grouping of the amplifier stages 30 to form groups $40_i$ is not effected statically in the system design, but rather adaptively. It is effected in particular during the operation of the system. It is effected by a configuration of the amplifier electronics, in particular by a switchable provision of the generated supply voltages at the amplifier stages via a multiplexer 50 for the supply voltage. For selecting the supply voltages, the multiplexer 50 can be controlled by a control device 51 with control signals. The control device 51 can be integrated into the control device 29 or be part thereof.

The various realization variants and exemplary embodiments described above are possible for arbitrary combinations of actuators 58 and amplifier stages 30 which are used in an interconnected arrangement in the optical assembly 25. This also includes, in particular, the simultaneous use of different actuators 58 and/or amplifier stages 30. In this case, it is possible to adapt, in particular to optimize, only a portion of the actuators 58 and/or amplifier stages 30 according to one or more of the variants described above. It is also possible to embody different actuators 58 and/or amplifier stages 30 in accordance with different possibilities from among those described above.

In order to ascertain optimum displacement trajectories $33_2$ and/or optimum position corrections for displacement positions 34, 35 to be maintained in a static fashion with actuators in an interconnected arrangement, it is possible to use various numerical methods from the field of multidimensional optimization problems. For example, the method can be ascertained by way of a model-based closed solution, for example via a pseudo-inverse method or a Lagrange optimization. A pseudo-inverse method is suitable particularly in the case of an equality condition for the power maximum. A Lagrange optimization is suitable particularly in the case of a less than/equal to condition for the power maximum.

It is also possible to ascertain the optimum displacement trajectory $33_2$ and/or optimum position correction by testing all possible alternatives (so-called brute force search).

Examples of suitable numerical methods for ascertaining optimum displacement trajectories $33_2$ and/or optimum position corrections include so-called steepest descent algorithms, simplex algorithms or cutting plane algorithms. Alternative algorithms are likewise possible.

A two-stage method, in particular, can be provided for determining the optimization parameters. In this case, provision is made for modelling the displacement trajectory $33_i$ via a monotonic function. The displacement trajectory $33_i$ is modelled in particular via a monotonic function which can be represented by superposed basis functions, in particular polynomials or sinusoidal oscillations of different frequencies, e.g. by a sum of such functions. The function for modelling the movement trajectory $33_i$ allows in particular the calculation of the involved electrical powers at every point of the displacement trajectory $33_i$.

The coefficients of the basis functions are then determined in a second step. A closed or a numerical optimization is provided for this purpose.

For an adaptive optimization of the displacement trajectories $33_2$ and/or of the position corrections, these methods can be realized and performed in an external, separate control unit, in particular in an external computing unit. They can also be realized and performed in near-actuator logic. Combinations of a partly external realization and partly near-actuator logic are likewise possible. The same applies to the realization of the electronic driving of the actuators 58.

Figure 16:
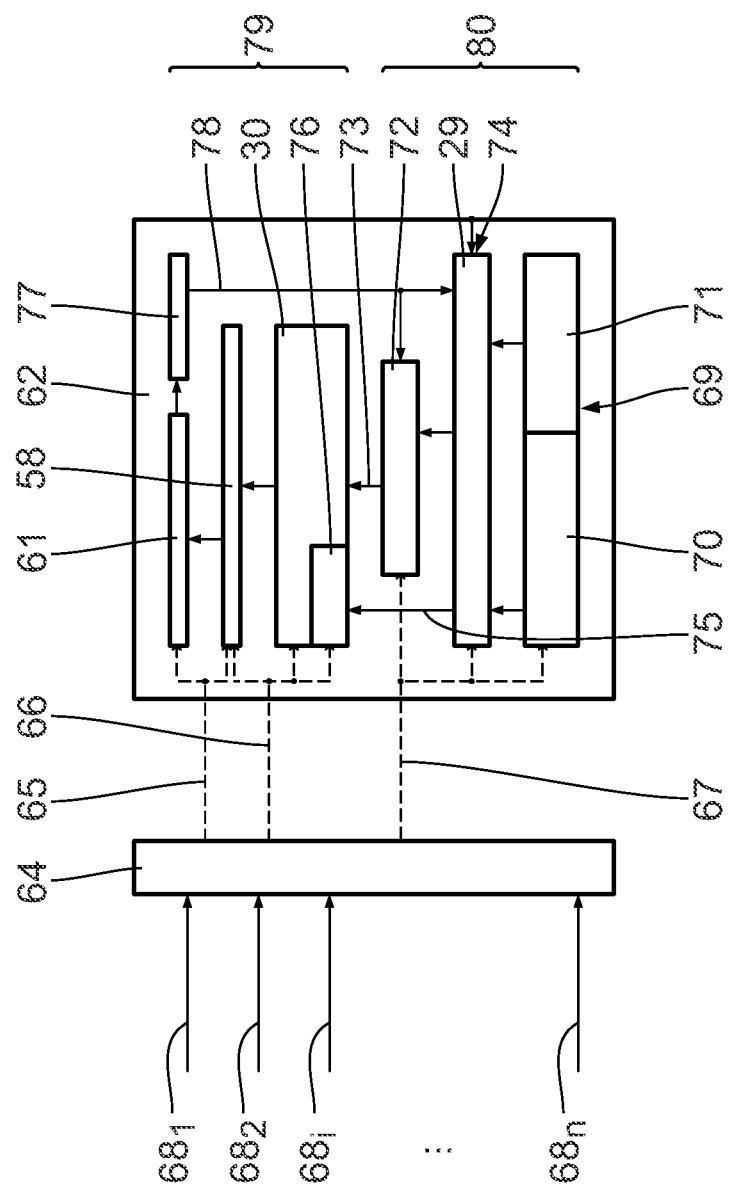
FIG. 16 shows a schematic illustration of the system construction and realization concept for minimizing the peak electrical power.

The concept according to the disclosure is described again generally below in different words with reference to FIGS. 16 and 17. FIG. 16 schematically illustrates the system construction and the realization concept for minimizing the peak electrical power during the displacement of a mechanical, in particular of an optical component 61 of a mechatronic system 62 with the aid of at least two actuators 58.

The left-hand side of FIG. 16 schematically illustrates a method step 64 representing the system design and the system optimization. This method step relates, according to the disclosure, to a selection from the following partial concepts indicated schematically: the mechanical system design 65, the electronic system design 66 and the algorithmic system design 67.

This is taken to mean in particular the design of the mechanical and electronic system components. In this case, the design of the electronic components means the selection and interconnection thereof, thereby achieving the electrical functionality striven for in the system.

A series of different requirements and boundary conditions $68_i$ are taken into account in the system design and system optimization. The boundary condition $68_1$ can represent for example the set of all possible displacement positions of the component 61. The boundary condition $68_2$ can represent the maximally allowed peak electrical power.

The variants provided according to the disclosure address a selection from the algorithmic, electronic and mechanical system design 65, 66, 67 before the start-up of the mechatronic system 62 and also the associated adaptive system configuration and realization of optimum actuation trajectories during the operation of the system. The various possibilities can advantageously be combined with one another.

The actuation trajectories, in particular the optimum actuation trajectories, the driving schemes and/or the associated driving protocols can be ascertained before the operation of the system and can be stored in a memory 69. The memory 69 can have different partial regions 70, 71 for storing possible configurations of the amplifier stages 30 and the displacement trajectories 33.

The displacement trajectories 33 can also be determined during the system operating time by the control device 29 using corresponding algorithmic approaches.

The memory 69 is connected to the control device 29 in a data-transmitting manner. The control device 29 includes the algorithmic mechanism for minimizing the peak electrical power $P_{max}$ during the actuation of the component 61. The control device 29 is connected to the amplifier stages 30 via one or a plurality of control and/or regulating units 72. The control device 29 can forward setpoint positions to the control and/or regulating units 72 in particular via one or a plurality of data transmission elements 73.

The control device 29 has a data input 74, which serves for predefining target displacement positions.

The control device 29 is connected via a further data transmission element 75 directly to the amplifier stages 30, in particular the configuration electronics 76 thereof, in a data-transmitting manner.

Moreover, the mechatronic system 62 includes one or a plurality of sensor elements 77. The sensor elements 77 serve for ascertaining the displacement positions of the components 61 to be displaced. The positions ascertained are forwarded to the control device 29 and/or the control and/or regulating units 72 via one or a plurality of data-transmitting connections 78.

The amplifier stages 30 with their configuration electronics 76 together with the components 61 to be displaced and the sensor elements 77 form near-actuator components 79.

The memory 69, the control device 29 and the control and/or regulating units 72 can be embodied as one or a plurality of separate assemblies 80. The separate assemblies 80 can be realized as near-actuator assemblies 80. They can also be realized as external assemblies 80, in particular as external digital logic assemblies.

Figure 17:
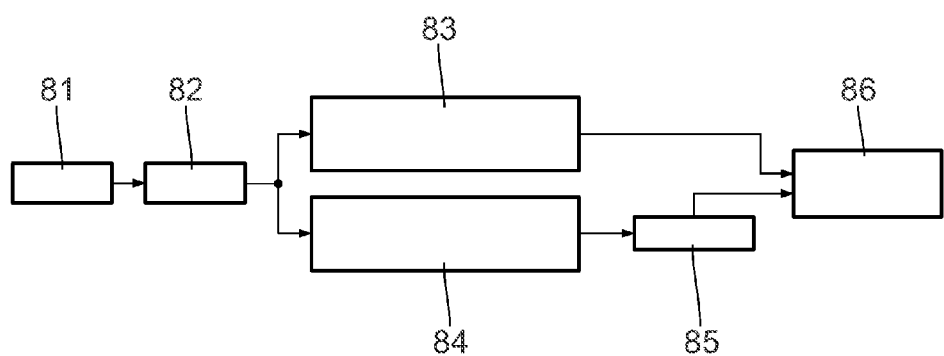
FIG. 17 shows a schematic illustration of the algorithmic implementation of the peak power reduction during the operation of the system.

FIG. 17 schematically illustrates the algorithmic implementation of the peak power reduction during the operation of the mechatronic system 62. Target positions, in particular new target positions, are predefined in a first step 81. This can involve the second displacement positions 35.

The actual positions of the components 61 are then measured in a measuring step 82. The actual positions can be the first displacement positions 34.

The measuring step 82 for determining the actual positions is followed, on the one hand, by a determining step 83, in which the displacement trajectories 33 associated with the actual and target positions are determined. This can be done either by reading out the corresponding displacement trajectories 33 from the memory 69, in particular the partial region 71, or by optimizing the displacement trajectories 33 during the operation of the system. Combinations of these two possibilities are likewise possible.

On the other hand, for determining the displacement trajectories 33, in addition provision can also be made of a determining step 84 for determining the driver amplifier configurations associated with the actual and target positions. The configurations can likewise be determined by reading from the memory 69, in particular from the partial regions 70 thereof, or by optimization during the operation of the system. Combinations of these two possibilities are likewise possible. The determining step 84 is followed by a configuration step 85 for configuring the amplifier stages 30.

Finally, a predefining step 86 involves predefining the setpoint values for the actuation of the mechanical elements via the actuators 58 operated via the driver amplifiers in accordance with the displacement trajectories 33.

During the use of the described components and methods according to the disclosure for the projection exposure apparatus 1, a reticle and the wafer are provided, the wafer bearing a coating that is light-sensitive to the illumination light 10. Afterwards, at least one section of the reticle is projected onto the wafer with the aid of the projection exposure apparatus 1. During the projection of the reticle onto the wafer, the reticle holder and/or the wafer holder can be displaced in a direction parallel to the object plane 6 and/or parallel to the image plane 9. The reticle and the wafer can preferably be displaced synchronously with one another. Finally, the light-sensitive layer on the wafer that has been exposed by the illumination light 10 is developed. A micro- or nanostructured component, in particular a semiconductor chip, is produced in this way.

Even though the disclosure has been described on the basis of a projection exposure apparatus 1, the application of the concept according to the disclosure is not restricted thereto. In principle, it is also applicable to other mechatronic systems in which the position of at least one mechanical element is to be set and/or regulated by electronic driving of at least two actuators 58. It is advantageous in particular for mechatronic systems whose mechanical elements are intended to be displaced in groups or in interconnected arrangements. It is of interest in particular for systems whose mechanical elements are intended to be displaced repeatedly, in particular at predefined points in time, for example periodically.

What is claimed is:

1. A method, comprising:
providing a mechatronic system comprising an optical element that is displaceable via at least two electrical actuators, the optical component having at least two degrees of freedom of displacement;
predefining a maximum power permitted to be consumed by all of the at least two electrical actuators together at an arbitrary point in time during the displacement of the optical component, the maximum power being less than a sum of maximum powers of all the individual electrical actuators of the at least two electrical actuators;
ascertaining a drive protocol for displacing the optical component from a first position to a second position along a trajectory while complying with the predefined maximum power; and
displacing the optical component via the at least two electrical actuators according to the driving protocol.

2. The method of claim 1, wherein ascertaining the driving protocol comprises:
predefining the trajectory of the optical component;
predefining or ascertaining a driving scheme for the optical component depending on the trajectory; and
ascertaining a temporal sequence of the displacement of the optical component.

3. The method of claim 1, further comprising a direction of the trajectory before beginning of the displacement process.

4. The method of claim 1, wherein the trajectory points in different directions at at least two points.

5. The method of claim 1, wherein the trajectory leads through a zero position of the optical component.

6. The method of claim 1, wherein the method comprises sequentially activating different electrical actuators of the at least two electrical actuators.

7. The method of claim 1, further comprising ascertaining an activation scheme in which a supply voltage of an actuator driver amplifier is adaptively adapted.

8. The method of claim 1, wherein the mechatronic system comprises a plurality of optical components, and each optical component is displaceable via at least two electrical actuators.

9. The method of claim 8, wherein determining the driving protocol comprises taking account of a possible storage of electrical energy in a local store and/or an electromagnetic crosstalk between electrical actuator devices of at least two optical components.

10. The method of claim 1, wherein a microlithography illumination optical system comprises the optical component.

11. An optical assembly, comprising:
a mechatronic system, comprising:
an optical component having at least two degrees of freedom of displacement; and
at least two electrical actuator devices configured to displace the optical component from a first position to a second position along a trajectory; and
a control device configured to control displacement of the optical element via the at least two electrical actuator devices,
wherein:
the optical assembly is configured so that the optical component is displaceable via controlled activation of the at least two electrical actuator devices into a predefined set of displacement positions and/or along a predefined set of trajectories;
the mechatronic system is configured so that a maximum total power consumption of the at least two electrical actuator devices when displacing the optical component into the predefined displacement positions and/or along the predefined trajectories is at most equal in magnitude to a predefined maximum power; and
the maximum power is less than a sum of maximum powers of all the individual electrical actuators of the at least two electrical actuators.

12. The optical assembly of claim 11, wherein:
the optical element has at least two rotation axes;
the at least two electrical actuator devices have at least two actuation axes; and
the rotation axes are rotated by an angle greater than 0° relative to the actuation axes.

13. The optical assembly of claim 12, wherein the angle by which the rotation axes are rotated relative to the actuation axes is configured to minimize the electrical power to set a displacement position which requires a maximum mechanical active power.

14. The optical assembly of claim 11, wherein the optical element is configured so that its zero position minimizes the peak electrical power required to set all the predefined displacement positions of the optical element.

15. The optical assembly of claim 11, further comprising a storage device configured to locally store electrical energy.

16. An illumination optical unit, comprising:
a facet mirror; and
an optical assembly according to claim 11,
wherein the illumination optical unit is a microlithography illumination optical unit.

17. An illumination system, comprising:
a radiation source; and
an illumination optical unit, comprising:
a facet mirror; and
an optical assembly according to claim 11,
wherein the illumination system is a microlithography illumination system.

18. An apparatus, comprising:
an illumination system, comprising:
a radiation source; and
an illumination optical unit, comprising:
a facet mirror; and
an optical assembly according to claim 11; and
a projection optical unit,
wherein apparatus is a microlithography projection exposure apparatus.

19. A method of using a microlithography projection exposure apparatus comprising an illumination optical unit and a projection optical unit, the method comprising:
using the illumination optical unit to illuminate at least some structures of a reticle; and
using the projection optical unit to project at least some of the illuminated structures of the reticle onto a light-sensitive material,
wherein the illumination optical unit comprises an optical assembly according to claim 11.

* * * * *